(12) United States Patent
Atherton

(10) Patent No.: US 6,888,509 B2
(45) Date of Patent: May 3, 2005

(54) TAMPER INDICATING RADIO FREQUENCY IDENTIFICATION LABEL

(75) Inventor: Peter S. Atherton, McLean, VA (US)

(73) Assignee: Mikoh Corporation, McLean, VA (US)

( * ) Notice: Subject to any disclaimer, the term of this patent is extended or adjusted under 35 U.S.C. 154(b) by 0 days.

(21) Appl. No.: 10/129,075

(22) PCT Filed: Mar. 21, 2001

(86) PCT No.: PCT/US01/08992

§ 371 (c)(1),
(2), (4) Date: Oct. 18, 2002

(87) PCT Pub. No.: WO01/71848

PCT Pub. Date: Sep. 27, 2001

(65) Prior Publication Data

US 2003/0075608 A1 Apr. 24, 2003

Related U.S. Application Data

(60) Provisional application No. 60/190,936, filed on Mar. 21, 2000.

(51) Int. Cl.[7] .......................... G08B 13/14; G06K 19/06
(52) U.S. Cl. ........................ 343/718; 343/878; 343/867; 343/873; 340/572; 340/571; 235/492
(58) Field of Search ................................. 343/718, 878, 343/867, 873, 700 MS, 895, 441, 897, 872; 340/572.1, 571, 568.1, 572.7; 235/492, 487, 488, 384, 441; 257/679, 782, 777, 778

(56) References Cited

U.S. PATENT DOCUMENTS

| | | | | |
|---|---|---|---|---|
| 5,708,419 A | * | 1/1998 | Isaacson et al. ......... | 340/572.5 |
| 5,867,102 A | * | 2/1999 | Souder et al. .......... | 340/572.8 |
| 5,884,425 A | * | 3/1999 | Baldwin ..................... | 40/638 |
| 5,949,059 A | * | 9/1999 | Rawson et al. ............. | 235/487 |
| 5,982,284 A | * | 11/1999 | Baldwin et al. ......... | 340/572.8 |
| 6,043,746 A | * | 3/2000 | Sorrells .................... | 340/572.7 |
| 6,091,607 A | * | 7/2000 | McKeown et al. ......... | 361/777 |
| 6,226,619 B1 | * | 5/2001 | Halperin et al. .............. | 705/1 |
| 6,262,692 B1 | * | 7/2001 | Babb ......................... | 343/895 |
| 6,313,747 B1 | * | 11/2001 | Imaichi et al. ........... | 340/572.5 |
| 6,353,420 B1 | * | 3/2002 | Chung ........................ | 343/895 |
| 6,395,373 B1 | * | 5/2002 | Conti et al. ................. | 428/138 |
| 6,404,643 B1 | * | 6/2002 | Chung ........................ | 361/737 |
| 6,421,013 B1 | * | 7/2002 | Chung ................ | 343/700 MS |
| 6,569,508 B1 | * | 5/2003 | Babb et al. ................ | 428/40.1 |
| 6,572,022 B1 | * | 6/2003 | Suzuki ....................... | 235/492 |
| 6,585,165 B1 | * | 7/2003 | Kuroda et al. ............. | 235/492 |
| 6,694,653 B1 | * | 2/2004 | Bradfield et al. ........ | 40/642.01 |
| 2001/0006368 A1 | * | 7/2001 | Maloney .................. | 340/568.1 |

* cited by examiner

Primary Examiner—Don Wong
Assistant Examiner—Chuc Tran
(74) Attorney, Agent, or Firm—Venable; James R. Burdett; Jeffri A. Kaminski

(57) ABSTRACT

A tamper indicating label is provided. The label may include RFID components and a tamper track coupled to the RFID components. The tamper track should be constructed from a destructible conducting path. Additionally, the tamper track can be formed such that it is damaged when the label is tampered. In one embodiment, adhesion characteristics of the tamper track are adapted to break apart the tamper track when the label is tampered, for example, by removal from an object. The RFID components may retain their RF capability and detect when the tamper track has been damaged to indicate that the label has been tampered. Alternatively, the RFID capability of the RFID components may be disabled when the tamper track is damaged, indicating tampering.

71 Claims, 16 Drawing Sheets

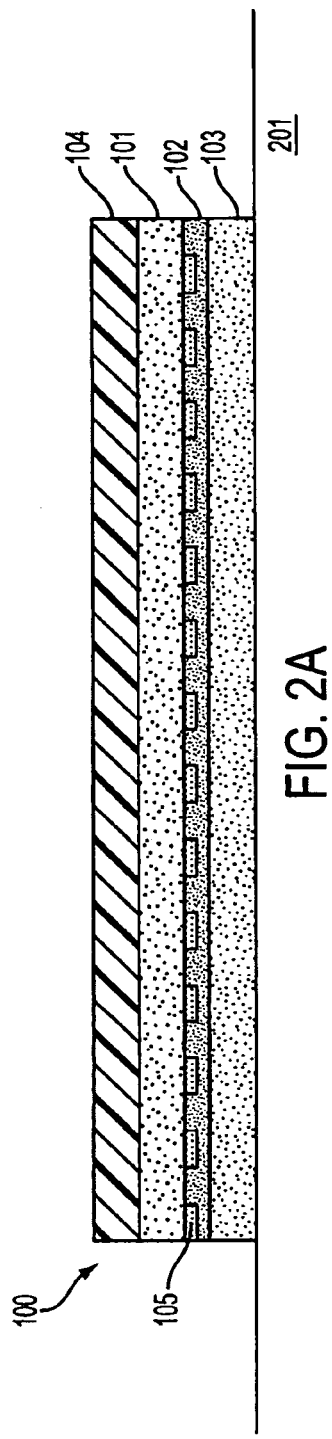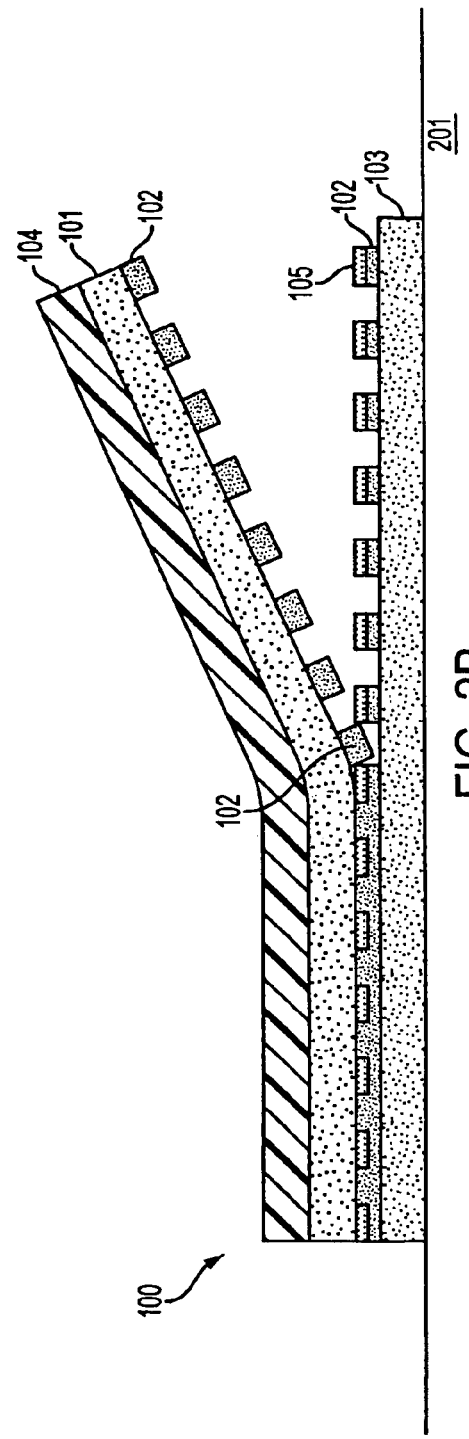

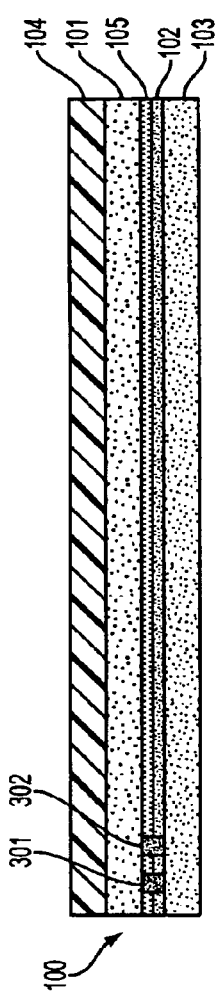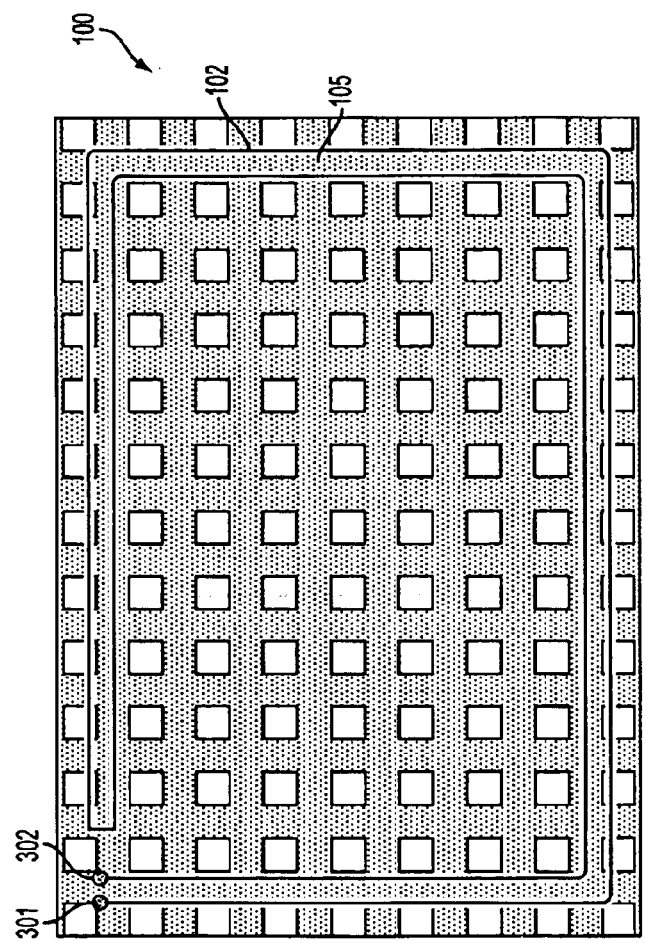
FIG. 3A
FIG. 3B

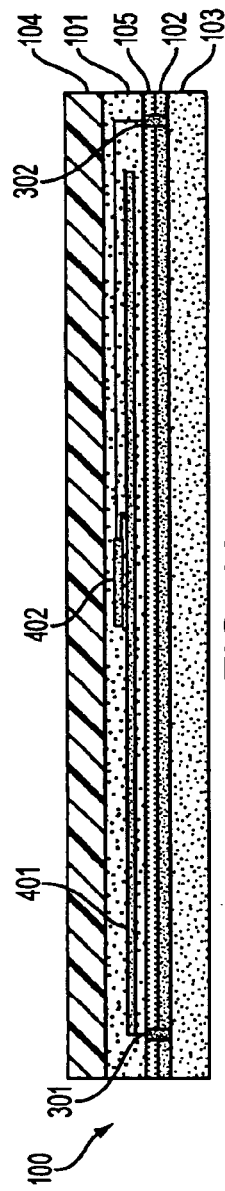
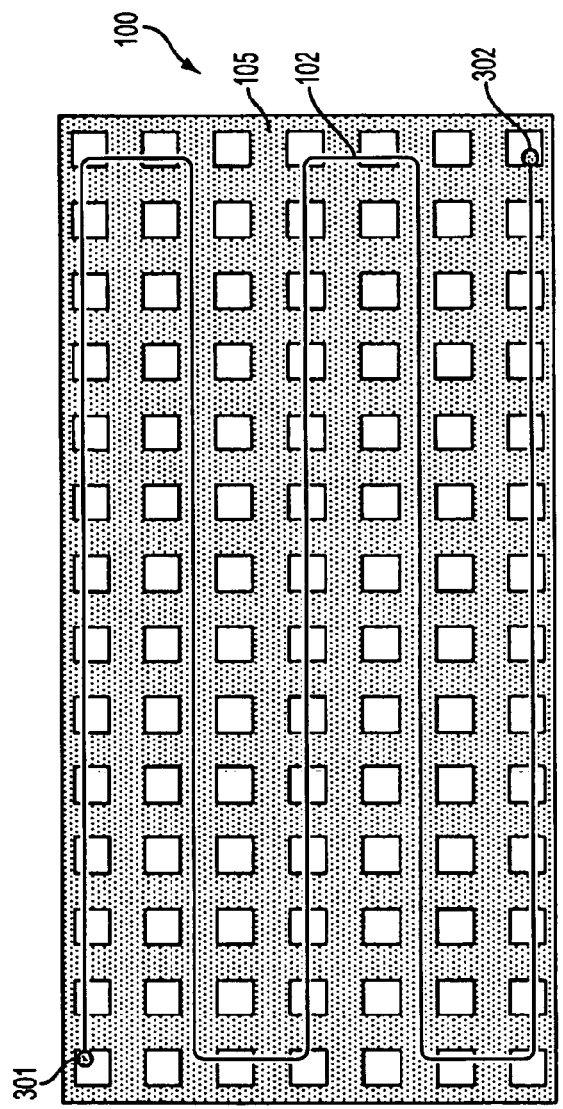
FIG. 4A
FIG. 4B

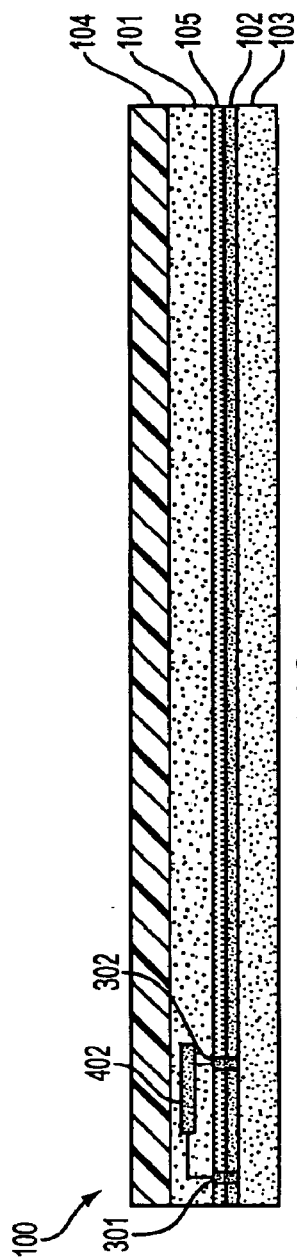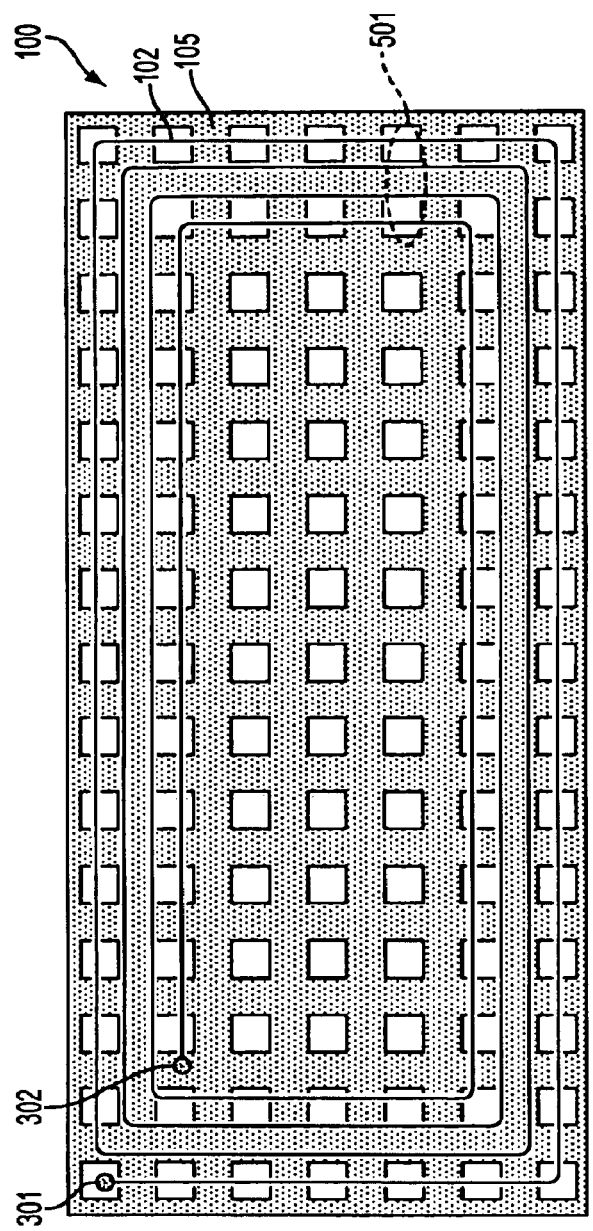

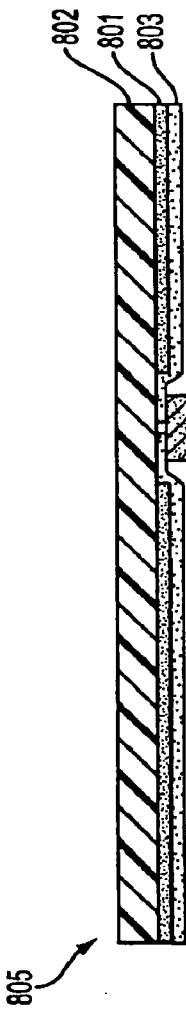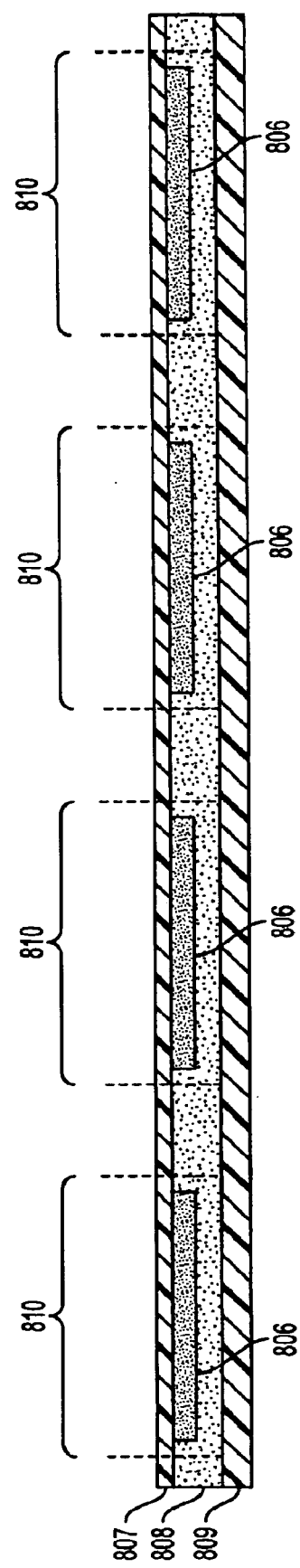

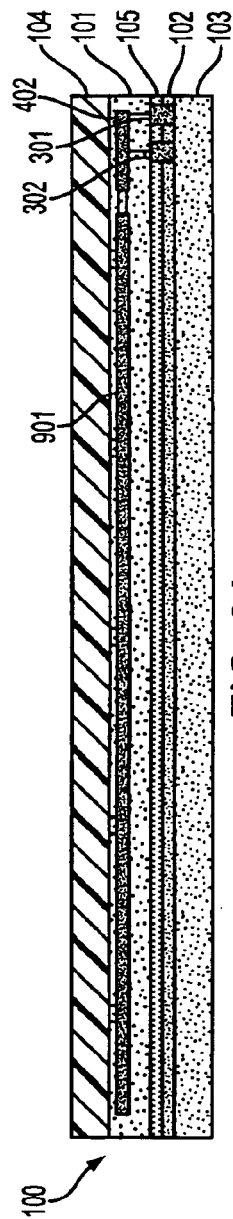
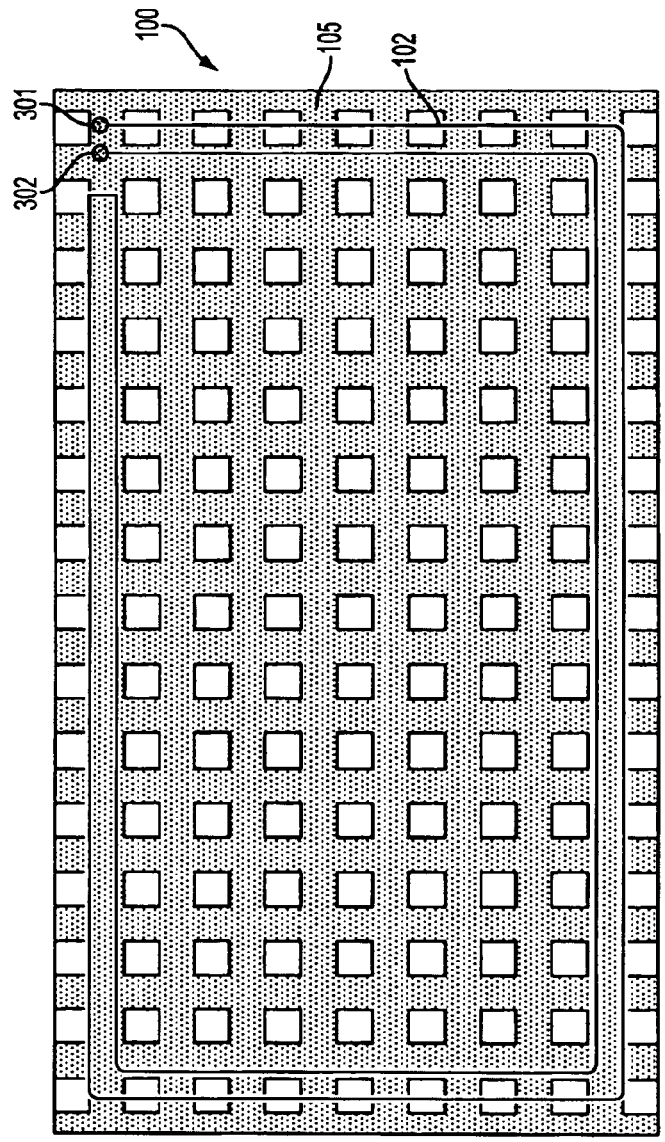
FIG. 9A
FIG. 9B

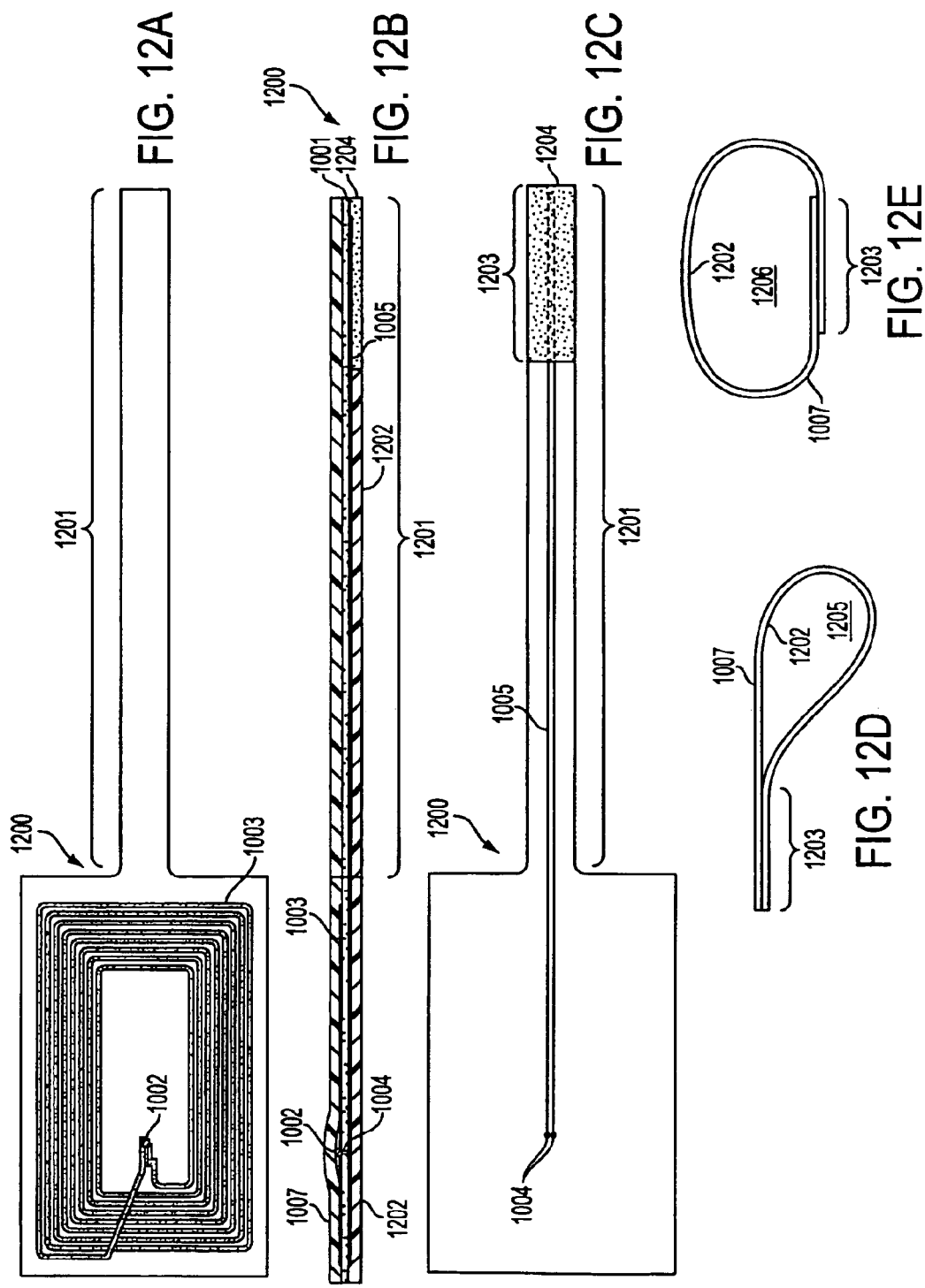

TAMPER INDICATING RADIO FREQUENCY IDENTIFICATION LABEL

This application claims the benefit of Provisional application Ser. No. 60/190,936, filed Mar. 21, 2000.

BACKGROUND OF THE INVENTION

Radio Frequency Identification (RFID) is being used increasingly as a means to identify goods at a distance, without requiring physical contact or even line of sight access to the goods. RFID enables information about an item to be stored on an item, and in some implementations also allows this stored information to be modified at a distance. The most compact and cost effective means to provide this RFID capability is by means of a pressure sensitive (i.e. self adhesive) label incorporating an RFID capability.

The ability to detect remotely whether a pressure sensitive label or seal applied to an item has been tampered with or removed is becoming increasingly important in order to detect theft, product substitution, tampering, warranty violation and other problems.

A disadvantage of current pressure sensitive RFID label technology is that it does not allow the remote determination of whether or not a label has been tampered with or removed and relocated.

DISCLOSURE OF THE INVENTION

A tamper indicating label is provided. The label may comprise RFID components and a tamper track connected to the RFID components. The tamper track is preferably formed by destructible electronics. The tamper track may be modified when the label is tampered with. In one embodiment, the RFID components are able to detect the modification in the tamper track while maintaining their RFID capability. Detection of the modification in the tamper track indicates tampering with the label. In an alternative embodiment, the modification in the tamper track disables the RFID function.

In a further embodiment, the label comprises an RFID layer. The RFID layer may include a memory chip and at least one of an antenna or loop inductor. Means for attaching the RFID layer to an object may also be provided. The means for attaching may be an adhesive layer. The adhesive layer can support the RFID layer. A destructible conducting path may be sandwiched between the RFID layer and the adhesive layer. The destructible conducting path should be disrupted when the label is tampered. The disruption preferably modifies in some way the RFID characteristics of the RFID layer.

In a further embodiment, at least a part of the destructible conducting path may in contact with the adhesive layer. The destructible conducting path can thereby be modified when the label is at least partially removed from a surface, and in turn, modify RFID characteristics of the label, indicating tampering.

According to another embodiment, the invention includes an RFID system. A substrate having a top and a bottom surface is provided. RFID electronic components are applied to the bottom surface of the substrate. A conductive layer may also be formed in a pattern on the bottom surface of the substrate. An adhesive layer may support the substrate such that the RFID electronic components and the conductive layer are sandwiched between the substrate and the adhesive layer. The adhesive layer, the substrate, and conductive layer should have relative adhesion strengths such that when the system is partially removed from a surface to which it has been applied, at least one of the RFID components and the conductive layer is altered to modify the RFID characteristics of the system.

According to another embodiment of the invention, a security apparatus for indicating tampering is provided. Here, an object may be provided with a conducting path having at least two end points. A security label is arranged on the object. The security label may be a tamper indicating label as described above and should include RFID components and a destructible conducting path between the RF components and each individual end point.

In one of the more detailed embodiments of the invention, a security label is combined with an object. The security label may comprise RFID components and means for attaching the RFID components to the object. Destructible electronics may be connected to the RFID components. The destructible electronics can be broken when the label is at least partially removed from the object. The object comprises a surface for receiving the security label and a conducting path having two ends. The ends of the conducting path may be connected to the destructible electronics thereby forming a circuit through the RFID components, the destructible electronics and the conducting path. The RFID characteristics of the RFID components may be modified if the connection between the end points and the destructible electronics is broken.

According to another embodiment of the invention, a substrate having first and second portions is provided. The second portion of the substrate may be adapted to be looped back and connected to the first portion. An RFID transponder can be arranged on the substrate. A tamper track may be coupled to the RFID transponder and should extend at least partially into the second portion of the substrate. An adhesive layer should be provided on at least a part of the second portion of the substrate that includes the tamper track. The tamper track in that part of the substrate may be adapted to be modified when the label is tampered with due to the relative adhesion strength of the tamper track.

BRIEF DESCRIPTION OF THE FIGURES

The present invention will now be described by way of non-limiting example with reference to the accompanying drawings, wherein:

FIGS. 2A and 2B are a schematic illustration of a preferred embodiment and characteristics of the tamper indicating layer within a tamper indicating RFID label;

FIGS. 3A and 3B are a schematic illustration of a preferred embodiment of the tamper indicating conducting strip in the tamper indicating layer of a tamper indicating RFID label;

FIGS. 4A and 4B are a schematic illustration of a preferred embodiment of a tamper indicating RFID label in which the tamper indicating conducting strip is in series with an induction loop in said label;

FIGS. 5A and 5B are a schematic illustration of a preferred embodiment of a tamper indicating RFID label in which the tamper indicating conducting strip forms the induction loop of said label;

FIGS. 8A and 8B are a schematic illustration of a method of manufacturing an RFD label according to an embodiment of the invention;

FIGS. 9A and 9B are a schematic illustration of another embodiment of the invention in which the RFID function of the label continues after the label is tampered with;

FIGS. 12A–12E are a schematic illustration of loop tag based on the tamper indicating label designs of FIGS. 9, 10 and 11;

DETAILED DESCRIPTION OF THE INVENTION

The term "passive", as used herein, refers to an RFID label or transponder which does not include an on-board power source such as a battery. The term "active", as used herein, refers to an RFID label or transponder which includes an on-board power source such as a battery. The advantages of an active RFID label, relative to a passive RFID label, are that an active RFID label can include continuous on-board functions such as a clock, and can usually enable longer data reading and writing distances. A disadvantage of active RFID labels, relative to passive RFID labels, is that active RFID labels are physically larger due to the need to carry an on-board power source.

It should be appreciated that the terms label and tag may be used interchangeably in this document. Where the term label is used, the term tag may validly be substituted. The essential difference between the two are the thicknesses and types of material used in the construction. In general a label will be made from thin, flexible materials, while a tag will be made from thicker, stiffer materials. A tag may, for example, be similar to a plastic card with a pressure sensitive adhesive on the underside. Such tags may be used, for example, as compliance plates or rating plates or specification plates on various types of equipment. A tag, because of its greater thickness, is better suited to active RFID technology.

It should be appreciated that the illustrations herein are not to scale. In general the thicknesses of the label constructions (and component layers thereof) illustrated in the figures have been exaggerated, to illustrate more clearly the internal structures and components.

In general, a tamper indicating RFID label is provided. The label may include RFID components and one or more tamper indicating electrically conducting paths, known herein as tamper tracks, coupled to the RFID components.

Each tamper track should be constructed from a destructible conducting path. Additionally, a tamper track can be formed such that it is damaged when the label is tampered. In one embodiment, relative adhesion characteristics of the tamper track are adapted to break the tamper track when the label is tampered, for example, by removal of the RFID label from an object to which it has been applied. In one embodiment, the relative adhesion characteristics of the tamper track may be modified by the inclusion of an adhesion modifying layer adjacent to the tamper track. The RFD components may retain their RFID capability and detect when the tamper track has been damaged to indicate that the label has been tampered. Alternatively, the RFID capability of the RFID components may be disabled when the tamper track is damaged, thereby indicating tampering.

Figure 1:
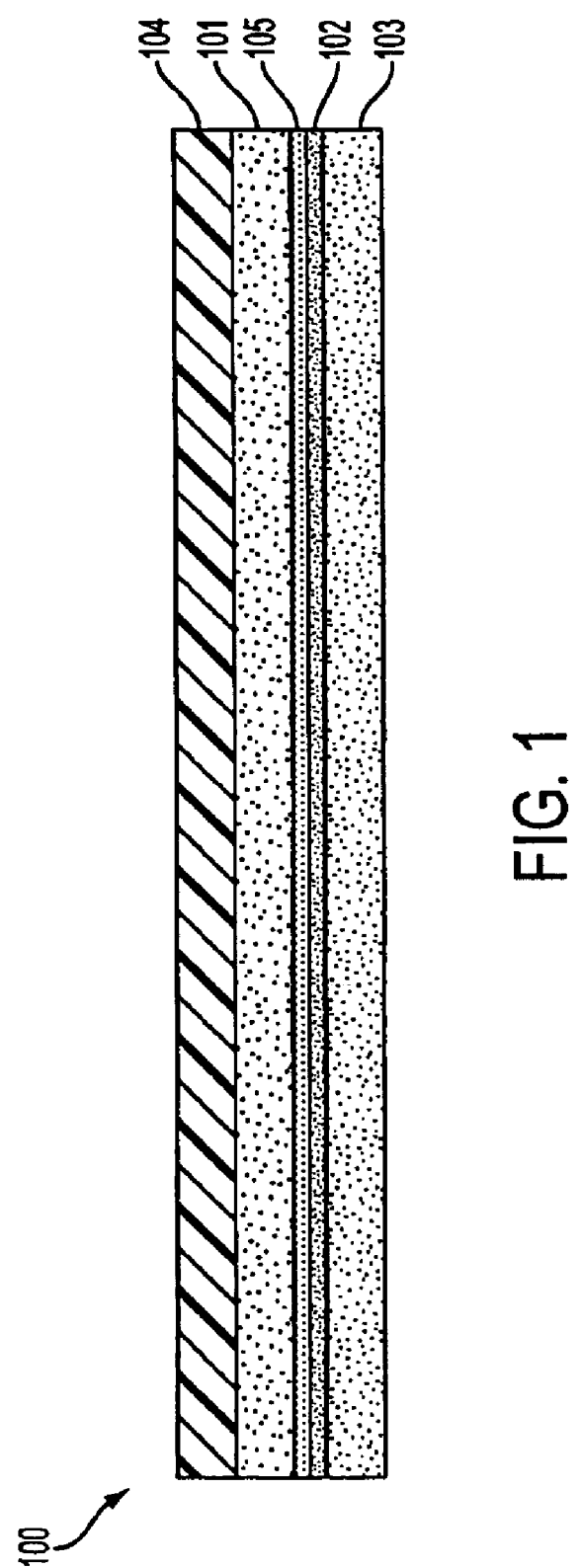
FIG. 1 is a schematic illustration of the general design of a tamper indicating RFID label which is the subject of the present invention.

FIG. 1 is a schematic illustration of the general design of a tamper indicating RFID label according to an embodiment of the invention. FIG. 1 shows schematically a pressure sensitive (i.e. self-adhesive) label 100 in cross sectional view. The label 100 may include four functionally distinct layers.

The RFID layer 101 may be a layer which includes RFID components, for example, an RFID memory chip. The label 100 may in some embodiments provide an "active" RFID capability, in which case the layer 101 can also include a battery or other power source.

The second layer 102 may include one or more thin electrically conducting paths which should be coupled to the RFID components in the layer 101. The electrically conducting paths are known herein as "tamper tracks" since they provide a means to detect tampering with or removal of the label 100 from a surface to which it has been applied.

The layer 101 and the tamper tracks 102 may together provide an RFID capability. On the other hand, in some embodiments the layer 101 can provide an RFID capability in its own right, while the tamper tracks 102 can modify the RFID performance of the layer 101 depending on whether said tamper tracks 102 are damaged or not.

The RFID capability provided by the layer 101, or the layers 101 and 102 together, usually includes the ability to store information in the RFID memory chip in the layer 101, and the ability to read and modify said stored information from a distance. Additional capabilities, such as the ability to encrypt stored information or control access to the stored information, may also be provided.

The third layer 103 may be an adhesive layer, which in some embodiments is a pressure sensitive adhesive.

The fourth layer 104 is a top-coat layer applied over the top of the RFID layer 101. The top-coat may be applied to protect the RFID layer and to provide a top surface to accept a printing process. The top coat layer 104 is not essential and in some embodiments may not be included. The finished construction is the adhesive label 100.

The tamper tracks 102 should be destructible. When the label 100 is applied to a surface and subsequently tampered or removed, the pressure sensitive adhesive 103 damages the tamper tracks 102—for example, by tearing all or part of them from the underside of the layer 101—which in turn affects the RFID performance of the label 100. Since the tamper tracks 102 are electrically connected to the RFID components in the label 100, and may form part of the RFID components of the label 100, the RFID function of the label 100 is modified if the label is applied to a surface and subsequently tampered or removed. In this way tampering with or removal of the label 100 can be detected at a distance via the change in the RFID characteristics and response of the label 100.

The terms "tampering" and "tampered" as used herein refer to complete or partial removal of a tamper indicating label, such as the label 100, from a surface to which it has been applied.

In this document the term "destructible" is used in relation to the tamper tracks 102 in FIG. 1 and in relation to other tamper tracks throughout the document. In this context the term destructible means that the tamper tracks are designed to be damaged or broken in regions of the label which are tampered.

The tamper tracks 102 may be produced in one of a number of different ways. In one preferred embodiment, the tamper tracks may be produced by printing electrically conducting ink (such as a carbon/graphite based conductive ink or a precious metal ink). In another preferred embodiment the tamper tracks 102 may be produced using electrically conductive adhesive. In another embodiment the tamper tracks may be metallic tracks made of Aluminum, Copper or some other suitable metal.

In general the tamper tracks 102 should be made from a material, such as an electrically conducting ink, which has appropriate electrical properties but which does not have high intrinsic physical strength. In this way the tamper tracks 102 can be more easily disrupted or damaged as the label 100 is partially or completely removed from a surface to which it has been applied.

In some preferred embodiments the destructibility of the tamper tracks 102 may be enhanced by including a thin layer 105 of a suitable adhesion modifying coating on the underside of the layer 101 either between the layer 101 and the tamper tracks 102, or between the tamper tracks 102 and the adhesive layer 103. Preferably, at least a part of the tamper tracks should contact the adhesive 103. The layer of adhesion modifying coating may be applied as a uniform layer, or in a specified pattern, or in some other manner such that the properties of the adhesion modifying coating vary across the layer 101. In some embodiments multiple layers of adhesion modifying coating may be applied to "fine tune" the properties of the final composite adhesion modifying coating. In the illustration of FIG. 1 the adhesion modifying layer 105 is shown between the RFID layer 101 and the tamper tracks 102, but it should be appreciated that in FIG. 1 and in later figures the adhesion modifying layer 105 may be either between the RFID layer 101 and the tamper tracks 102 or between the tamper tracks 102 and the adhesive layer 103.

Inclusion of a adhesion modifying coating 105 between the RFID layer 101 and the tamper tracks 102 results in the adhesion of the layers 101 and 102 to each other being greater or less in a particular region according to whether the adhesion modifying coating 105 is present or absent in that region. Similarly, inclusion of an adhesion modifying coating 105 between the tamper tracks 102 and the adhesive layer 103 results in the adhesion of the layers 102 and 103 to each other being greater or less in a particular region according to whether the adhesion modifying coating 105 is absent or present in that region. Usually, but not necessarily, the adhesion modifying coating 105 reduces the adhesion of two layers that it separates, so that the two layers can be more easily separated.

The relative adhesion between the layer 101, adhesion modifying coating 105, the tamper tracks 102, and adhesive layer 103 can be adjusted so that when the label 100 is applied to a surface and subsequently tampered or removed, the tamper tracks 102 are damaged. Such damage may preferably occur in a pattern corresponding to the pattern of the adhesion modifying coating 105. In some embodiments the tamper tracks 102 may be physically separated in a pattern corresponding to the pattern of the adhesion modifying coating 105, with some of the tamper tracks 102 remaining on the layer 101 and the remainder of the tamper tracks 102 remaining on the adhesive layer 103. This damage to the tamper tracks 102 may affect the RFID performance of the label 100.

The adhesion modifying coating 105 may be a layer of lacquer, or a layer of tamper indicating varnish (for example, similar to that used in some visual tamper indicating label constructions), or a layer of some other suitable material formulation.

The tamper indicating characteristics of one preferred embodiment of the label 100 are illustrated in FIG. 2, which shows the label 100 in cross section view before and after partial removal from a surface 201. FIG. 2 illustrates in particular the physical disruption of the tamper tracks 102 during tampering or removal of the label 100. In FIG. 2(a) the label 100 is shown before removal from the surface 201. Here the tamper tracks 102 are intact and the label 100 exhibits its normal RFID operation. In this preferred embodiment an adhesion modifying layer 105 is applied as a thin layer in a specified pattern between the layer 101 and the tamper tracks 102. In this preferred embodiment the adhesion modifying layer 105 reduces adhesion between the layer 101 and the tamper tracks 102 in those regions where the adhesion modifying layer 105 is applied. In FIG. 2(b) the label 100 has been partially removed from the surface 201. As the label 100 is removed, portions of the tamper tracks 102 where there is no adhesion modifying layer 105 remain with the top layer 101, and complementary portions of the tamper tracks 102 where the adhesion modifying layer 105 has been applied remain with the adhesive layer 103. The differential separation of the tamper tracks 102 is therefore enhanced or achieved through the inclusion of an adhesion modifying coating 105 (as described above) in a specified pattern at the interface between the layer 101 and the tamper tracks 102, such that the tamper tracks 102 bond less strongly to the layer 101 where the adhesion modifying coating 105 has been applied and therefore in such regions the tamper tracks 102 remain with the adhesive layer 103 when the label 100 is removed from the surface 201. In other embodiments the adhesion modifying layer 105 may be applied in different specified patterns to the layer 101, or may be applied as a uniform layer to the layer 101. As the label 100 is removed from the surface 201, the tamper tracks 102 are damaged, and their electrical properties are thereby affected. This in turn affects the RFID properties of the label 100, since the tamper tracks 102 are electrically connected to the RFID layer 101 which includes RFID components. In FIG. 2 the separation of (i.e. damage to) the tamper tracks 102 during tampering of the label 100 is shown to form a regular repeating pattern. It should be appreciated that the pattern of the separation may instead be irregular and may be on a larger or smaller scale relative to the size of the label 100 or the RFID components in the label 100 than shown in FIG. 2.

The label 100 may also contain information in another format, such as a barcode, 2D barcode, or some other optical information storage format printed on the top surface of the top coat layer 104.

A preferred embodiment of the tamper tracks 102 will now be described with reference to FIG. 3, which shows an embodiment of the RFID label 100 in cross sectional view and looking from below through the adhesive layer 103 at the tamper tracks 102 and adhesive modifying layer 105. In the embodiment of FIG. 3 the adhesion modifying layer 105 is printed in a specified pattern rather than as a solid, continuous layer. In FIG. 3 the RFID layer 101 has two "through-connect" electrical connection points, 301 and 302, where the electrical circuitry in the RFID layer 101 is connected to the underside of the layer 101. In this embodiment the electrical connection between the points 301 and 302 by means of the tamper track 102 should be intact in order to maintain normal RFID operation of the label 100.

Preferably the tamper track 102 may be disrupted even if only a portion of the label 100 is tampered. In FIG. 3 the tamper track 102 runs around the perimeter of the underside of the layer 101 between points 301 and 302. This configuration for the tamper track 102 of FIG. 3 ensures that tampering of even a small portion of the label 100 will result in a break in the tamper track 102 and therefore a break in the electrical connection between the points 301 and 302, which in turn modifies the RFID behavior of the label 100.

It should be appreciated that other configurations of the tamper track 102 could also be employed. For example, in some embodiments the tamper track 102 may form all or part of an antenna, in which case the points 301 and 302 may not be electrically connected to each other via a single tamper track 102.

An RFID label will generally include an electronic integrated circuit (chip) connected to either an induction loop or an antenna. The induction loop or antenna may enable communication and data exchange with a remote RFID reading device. (It should be appreciated that different types of antenna design may be employed.) Other electrical or electronic components may also be included in an RFID label. An active RFID label will include an onboard power source such as a battery.

Preferred embodiments of ways in which the tamper tracks 102 may be configured on the underside of the RFID layer 101 and coupled to the RFID layer 101 will be now be described by way of non-limiting example. It should be appreciated that in some embodiments the tamper tracks 102 may be designed to be destructible in some regions and durable in other regions. For example, the tamper tracks 102 may include some sections which are durable and rugged, joined by sections which are destructible.

The tamper tracks 102 may be connected in one of several different ways to the RFID layer 101, depending on the design and operation of the RFID layer 101. Several non-limiting examples are listed below.

1. The tamper tracks 102 may be connected in series with an induction loop or antenna in the layer 101.

2. The tamper tracks 102 may constitute all or part of the induction loop or antenna of the label 100.

3. The tamper tracks 102 may be part of a tamper-sensing electrical circuit in the label 100 which is separate from the induction loop or antenna of the label 100.

FIGS. 4 to 7 are schematic illustrations of further preferred embodiments of the tamper indicating RFID label 100, showing both a cross sectional view and a view looking from below through the adhesive layer 103 at the tamper tracks 102 and adhesion modifying layer 105.

FIGS. 4A, 4B are a schematic illustration of a preferred embodiment in which the tamper track 102 connects the points 301 and 302 and is in series with an induction loop 401 in the RFID layer 101. The RFID layer 101 may include the induction loop 401 and other components 402, which may be passive or active. For example, the components 402 in one embodiment may be a capacitor which, with the induction loop 401, forms a resonant electrical circuit. Alternatively, the components 402 may include a passive RFID electronic memory chip for storing data. The tamper track 102 should be intact for the RFID label 100 of FIG. 4 to be operational. When the label 100 is tampered, the tamper track 102 is broken and the RFID function of the label 100 can be disabled or modified. In this way it can be determined whether or not the label 100 has been tampered. An adhesion modifying layer 105 may be included, as described above, to enhance destructibility of the tamper tracks 102.

FIGS. 5A, 5B are a schematic illustration of another preferred embodiment in which the tamper track 102 forms an induction loop 501 for the RFID label 100. In FIG. 5 the through-connect points 301 and 302 are connected to the RFID components 402 in the layer 110. In connecting the points 301 and 302, the tamper track 102 forms a number of loops, with the overall layout of the tamper track 102 acting as an induction loop. Tampering or removing the label 100 results in a break in the tamper track 102, thereby disabling or modifying the RFID function of the label 100. In this way it can be determined whether or not the label 100 has been tampered. An adhesion modifying coating 105 may be included, as described above, to enhance destructibility of the tamper tracks 102.

Figure 6A:
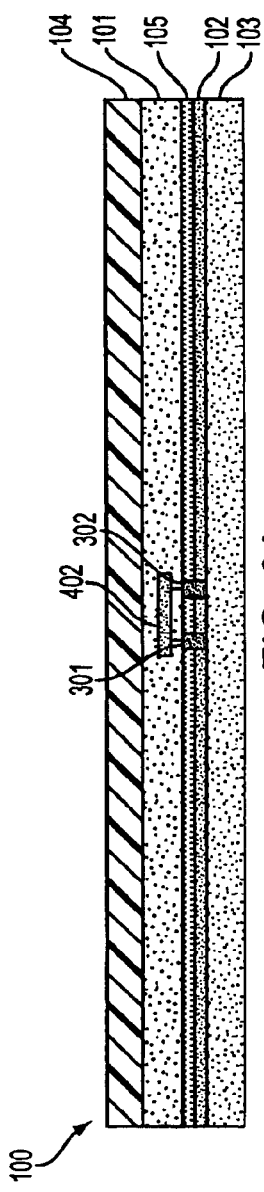
FIGS. 6A and 6B are a schematic illustration of a preferred embodiment of a tamper indicating RFID label in which the tamper indicating conducting strips form the antenna of said label.
Figure 6B:
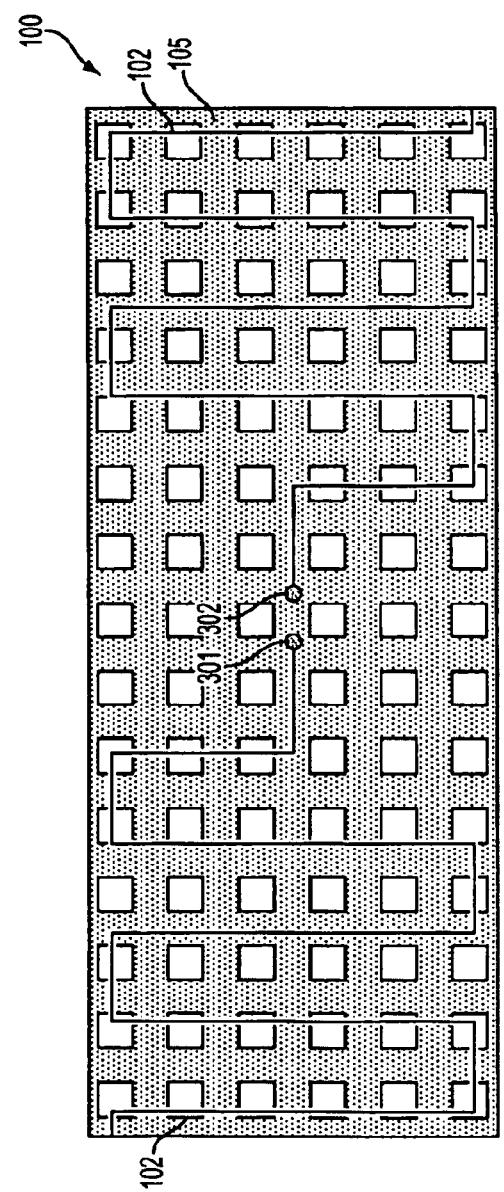
Figure 7A:
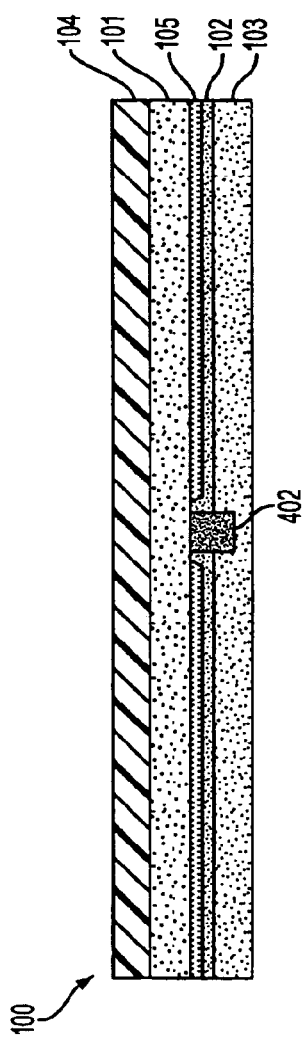
FIGS. 7A and 7B are a schematic illustration of a variation on the RFID label of FIG. 6.
Figure 7B:
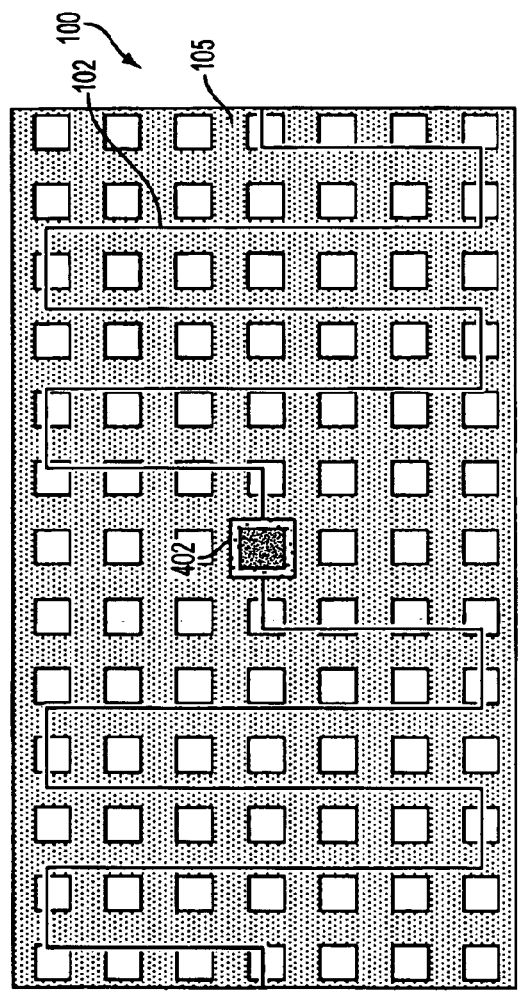
Figure 7C:
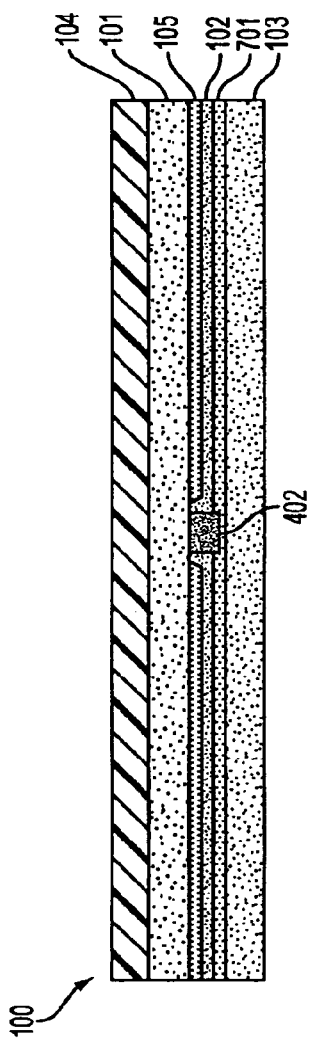
FIGS. 7C and 7D are a schematic illustration of a variation on the RFID label of FIGS. 7A and 7B in which a visual tamper indicating feature is included in addition to the RFID tamper indicating feature of FIGS. 7A and 7B.
Figure 7D:
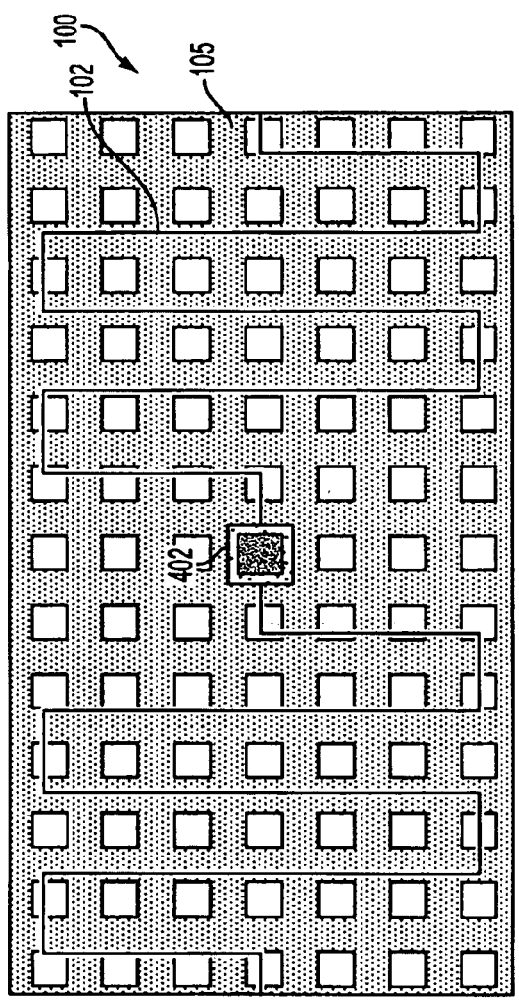

FIGS. 6A, 6B are a schematic illustration of another preferred embodiment, which is a variation on the embodiment of FIG. 5. In FIG. 6 the tamper tracks 102 form an antenna, whereas in FIG. 5 the tamper track 102 forms an induction loop. The principal difference is that in FIG. 6 the points 301 and 302 are not connected together by a single tamper track 102. Instead there are two tamper tracks 102, one starting at point 301 and the other starting at the point 302. The two tamper tracks 102 form an antenna. In FIG. 6 a so-called meander antenna is illustrated, although it should be appreciated that other forms of antenna may also be employed. In some antenna designs the points 301 and 302 may be connected to each other by the tamper track 102. In FIG. 6 the through-connect points 301 and 302 are connected to the RFID components 402 in the RFID layer 101. Tampering of the label 100 should result in damage to at least one of the tamper tracks 102, thereby affecting the characteristics of the antenna and modifying or disabling the RFD function of the label 100. In this way it can be determined whether or not the label 100 has been tampered. An adhesion modifying coating 105 may be included, as described above, to enhance destructibility of the tamper tracks 102.

FIGS. 7A–7D are a schematic illustration of another preferred embodiment, based on the embodiments of FIG. 6. The principal difference between the design illustrated in FIG. 6 and the design illustrated in FIG. 7 is that in the design of FIG. 7 the RFID components 402 are on the underside of the layer 101. In some embodiments the RFID components 402 may comprise only an RFID memory chip, in which case in the design of FIG. 7 both the RFID memory chip 402 and the tamper tracks 102 are on the underside of the RFID layer 01. The tamper tracks 102 are designed to be destructible, as described herein. An advantage of the design of FIG. 7 compared with the design of FIG. 6 is that in the design of FIG. 7 there is no need for through-connects from the top side to the bottom side of the layer 101, since the RFID memory chip is on the bottom side of the layer 101. In the design of FIG. 7 the tamper tracks 102 form an antenna, as in the design of FIG. 6. In a variation on the design of FIG. 7, the tamper tracks 102 may form an induction loop, as in the design of FIG. 5. An adhesion modifying coating 105 may be included, as described above, to enhance destructibility of the tamper tracks 102.

In order to provide an additional indicator of tampering, the label 100 may be designed to show visual evidence of tampering if the label is tampered with or removed from a surface to which it has been applied. Visual tamper indication can be achieved in one of several ways. In one embodiment a thin colored layer 701 is applied to the underside of the RFID layer 101. A pattern of visual adhesion-modifying layer may be applied to the underside of the colored layer. The visual adhesion-modifying layer may be the same layer or a layer in addition to the RFID adhesion modifying layer 105 described above. The presence of the visual adhesion-modifying layer modifies the adhesion of the colored layer 701 to the adhesive layer 103 such that when the label 100 is removed from a surface to which it has been applied, the colored layer 701 breaks up according to the pattern of visual adhesion modifying layer. Areas of color may adhere to the adhesive layer 103 and other complementary areas of color may adhere to the RFID layer 101. An alternative to this embodiment is to apply a pattern of said visual adhesion modifying layer directly to the underside of the RFID layer 101 and apply said thin colored layer to the underside of said visual adhesion modifying layer either before or after application of the tamper tracks 102. In another embodiment, the visual adhesion modifying layer may be applied directly to the underside of the RFID layer 101 and a colored adhesive can be used as the adhesive layer 103. In this case, when the label is removed from a surface to which it has been applied, the colored adhesive 103 should break up and areas of the colored adhesive may adhere to the RFID layer 101 and complementary areas of the colored adhesive 103 may adhere to the surface. It should be appreciated that other methods may be used to produce a visual tamper indicating effect.

When using a visual tamper indicating effect, a portion of the RFID layer 101 and top coat 104 (if a top coat 104 is present) should be transparent so the visual effect can be seen by looking through the RFID layer 101 and top coat 104. This enables easy inspection of the visual tamper indicating feature without having to remove the label 100. The RFID components in the RFID layer 101, such as an RFID memory chip, may not be transparent, but should only occupy a small portion of the surface area.

Additionally, it may be desired to print information or patterns on the label. For example, as described above, a bar code or serial number may be printed on the top surface of the RFID layer 101 or on the top surface of the top coat 104 (if a top coat 104 is present). Enough of the RFID layer 101 and top coat 104 should be transparent to allow the visual tamper indicating feature to be visible.

Method of Manufacture

A preferred method of manufacture for the label configuration described above in relation to FIG. 7 is now described and illustrated schematically in FIGS. 8A, 8B, which show illustrations of an RFID label construction and method of manufacture in cross sectional view.

The diagram of FIG. 8 illustrates a passive RFID label construction, in which the RFD components 402 consists of an RFID electronic memory chip.

A pattern 801 of adhesion modifying coating may be applied to the underside of a substrate layer 802, which may in one embodiment be a polyester layer. The tamper tracks 803 can be printed on the underside of the adhesion modifying layer 801. If necessary the tamper tracks can include a "cross-over", where a tamper track 803 crosses over itself along a bridging layer of electrical insulator. The tamper tracks 803 may be configured to form either an induction loop or antenna of appropriate design and characteristics. An RFID electronic memory chip 804 can then be mounted on the underside of the layer 802 and positioned to connect to appropriate terminating points on the tamper tracks 803. The RFID chip 804 and tamper tracks 803 should form an RFID transponder. The construction 805 consisting of substrate 802, adhesion modifying coating 801, tamper tracks 803 and RFD chip 804 is cut into individual transponders 806. Each transponder 806 is placed in a specified position on the underside of a top coat layer 807 and may be fixed in position with a thin adhesive layer. A layer of pressure sensitive adhesive 808 may be applied to the underside of the top coat 807 and individual transponders 806. The resulting construction consisting of top coat layer 807, individual transponders 806 and adhesive layer 808 is mounted on a suitable carrier film 809 and produced in roll form. The resulting roll is die cut into individual labels 810 mounted on the continuous carrier film 809, where each label 810 includes one transponder 806.

In a variation on the method of manufacture illustrated in FIG. 8, the tamper tracks 803 may be produced using an electrically conducting adhesive instead of an electrically conducting ink.

Tamper Indicating RFD Label with Tracking Capability

FIGS. 9A, 9B are a schematic illustration of another preferred embodiment in which the tamper track 102 forms part of a separate tamper indicating electrical circuit. As shown in FIG. 9 the RFD layer 101 may contain an induction loop or antenna 901 and other electronic components 402, including an RFID electronic memory chip, to provide an RFID capability. The RFID layer 101 should be capable of interacting with an RFID reading device to allow reading of or modification to data stored in the electronic memory chip. The through-connect points 301 and 302 are connected to the components 402 in the layer 101, and to each other via the tamper track 102. The components 402 should be configured to respond differently to a signal from an RFID reader depending on whether or not the points 301 and 302 are connected to each other via the tamper track 102. If the tamper track 102 is intact, the label 100 will respond in a specified manner to an RFID reader. On the other hand, if the label 100 is tampered, so that the tamper track 102 is damaged and the points 301 and 302 are no longer connected to each other via the tamper track 102, the label 100 should still respond to an RFID reader but in a different manner, thereby indicating that the label 100 has been tampered. In this way the label 100 of FIG. 9 can provide an RFID means to (i) determine whether the label 100 is present, (ii) read data from the label 100 and modify data stored in the label 100, and (iii) determine whether the label 100 has been tampered. In one preferred embodiment the components 402 may consist only of a passive RFID electronic memory chip, and the tamper track 102 forms a connection, which may be separate from the induction loop or antenna 901, between two contact points on the RFID memory chip. An adhesion modifying coating 105 may be included, as described above, to enhance destructibility of the tamper tracks 102.

In a variation on the embodiments described above, the components 402 may undergo an irreversible change if the label 100 is tampered and the tamper track 102 is damaged, so that even if the tamper track 102 is subsequently restored, the label 100 will still respond to an RFID reader with a signal indicating it has been tampered. In one preferred embodiment the RFID components 402 are "active" (i.e. powered) and are configured to test the integrity of the tamper track 102 either continuously or at specified intervals. In this embodiment if the RFID components 402 detect that the tamper track 102 has been disrupted they may then preferably be configured to record data to this effect in an electronic memory within the components 402, preferably in a manner which is permanent and irreversible. Preferably, if the components 402 are active, they may also include a clock. In this case, the date and time of any tampering of the tamper track 102 or label 100 may also preferably be recorded permanently and irreversibly in an electronic memory within the RFID components 402.

A preferred embodiment of the tamper indicating RFID label configuration of FIG. 9 will now be described by way of non-limiting example with reference to the schematic illustrations shown in FIGS. 10 and 11.

It should be appreciated that the term antenna as used below may refer to a conventional antenna or to an induction loop (which is used as an antenna at some RFID operating frequencies).

FIGS. 10A–10D is a schematic illustration of a tamper indicating RFID label 1000 shown in top view, cross sectional side view, and bottom view.

The label 1000 may include a substrate layer 1001 made of, for example, polyester or some other suitable material. On top of the substrate layer 1001, electronics to form an RFD transponder, which provides an RFID function, may be applied. The electronics may include an RFID electronic memory chip 1002 and an antenna 1003. (In FIG. 10 an antenna 1003 in the form of an induction loop is shown.)

Figure 10A:
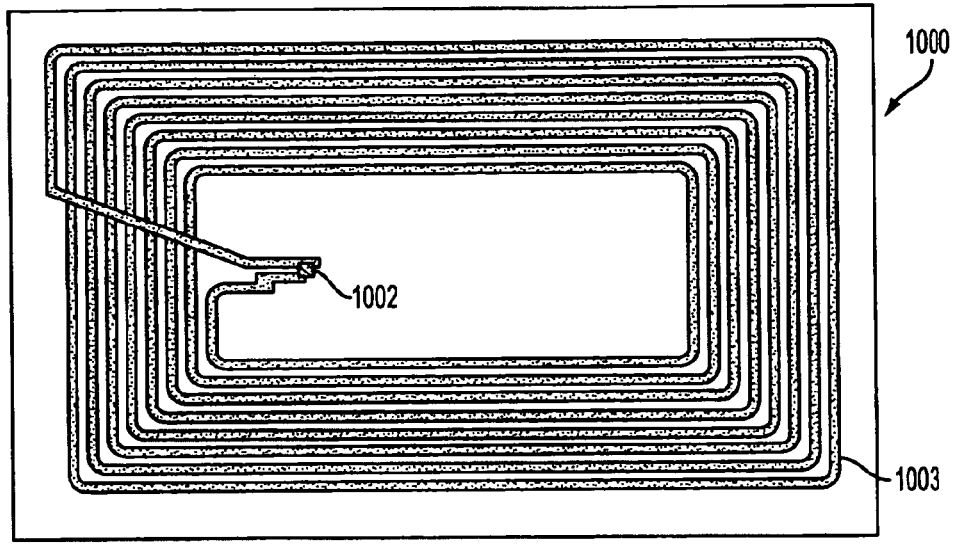
FIGS. 10A–10D are a schematic illustration of the top view, side view and bottom view of a preferred embodiment of a tamper indicating RFID label of the general type illustrated in FIG. 9.
Figure 10B:
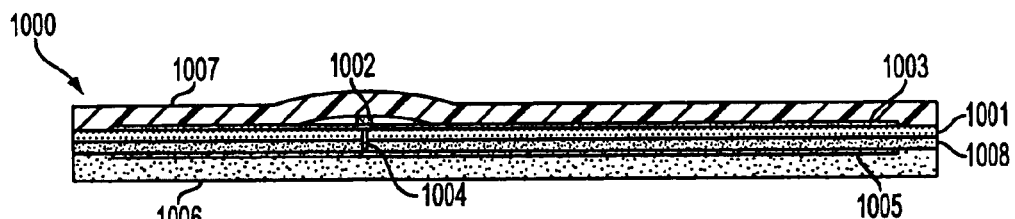
Figure 10C:
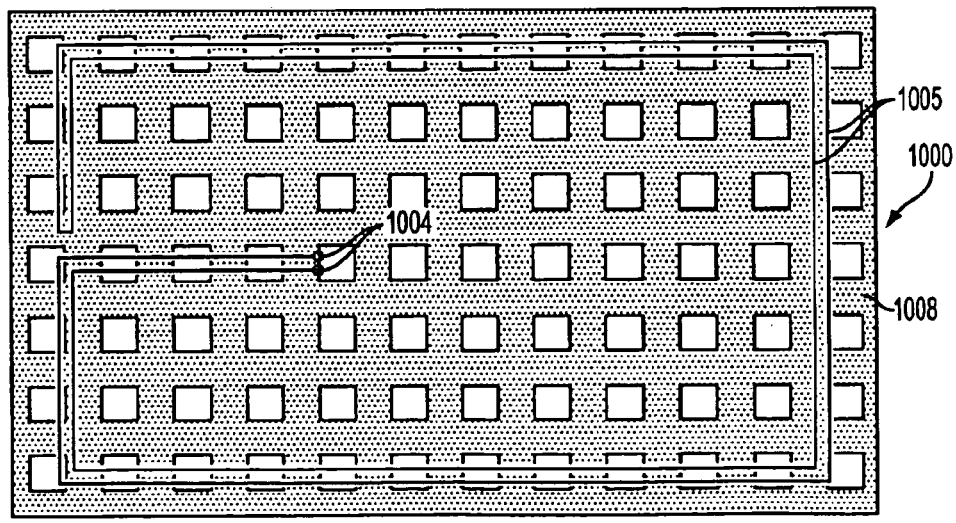
Figure 10D:
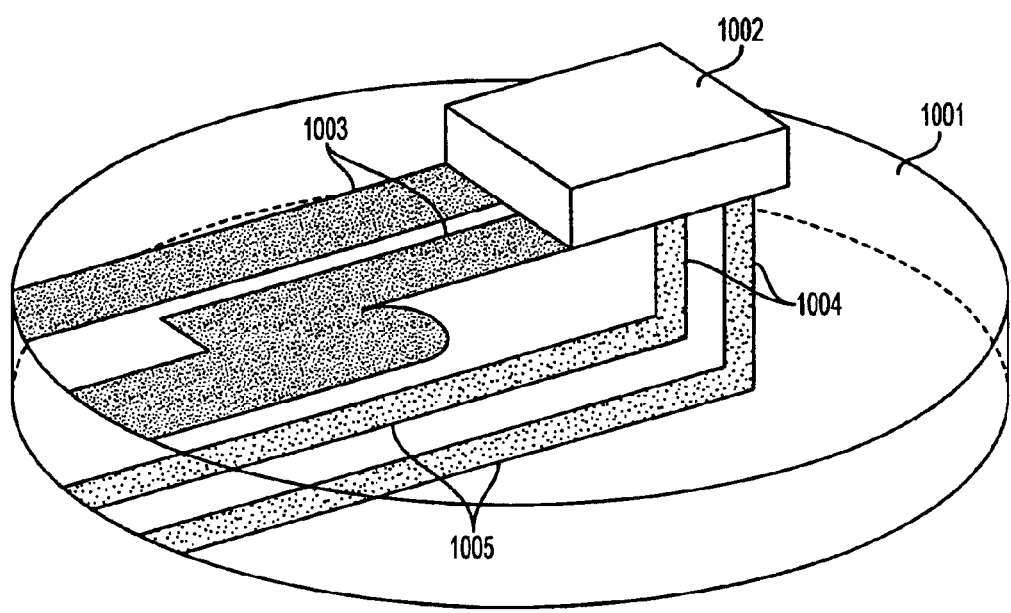

FIG. 10D is a more detailed schematic illustration of an example of the electrical connections to the RFID electronic chip 1002.

The chip 1002 and antenna 1003 should provide an RFID capability, which may include the ability to store information in the chip 1002, the ability to read information from the chip 1002 at a distance using a suitable RFID device, and the ability to modify information in the chip 1002 from a distance using a suitable RFD device.

The chip 1002 may include two contact points, or contact pads, connected to the antenna 1003, as illustrated in FIGS. 10A and 10D.

Two contact pads on the chip 1002 can be connected via electrical "through-connects" 1004 to the underside of the substrate layer 1001. One or both or neither of these two contact pads may be the same as the contact pads used to connect the chip 1002 to the antenna 1003.

FIG. 10 shows the through-connects 1004 directly beneath the chip 1002. It should be appreciated that other configurations may instead be used for the through-connects 1004. In another preferred embodiment, the through-connects 1004 are positioned away from the chip 1002, and electrical tracks on the top surface of the substrate layer 1001 connect the contact pads on the chip 1002 to the tops of the through-connects 1004.

The two through-connect points 1004 on the underside of the substrate layer 1001 are connected to each other by means of a tamper track 1005 which is positioned on the underside of the substrate layer 1001.

A layer of adhesive 1006 may also be applied to the underside of the substrate layer 1001 and tamper track 1005. Preferably said adhesive 1006 is a pressure sensitive adhesive. One or more adhesion modifying layers 1008 may also be provided on the underside of the substrate layer 1001, as described herein, to promote damage to the tamper track 1005 if the label 1000 is tampered or removed from a surface to which it has been applied.

A top layer 1007 maybe applied over the top of the substrate 1001, chip 1002 and antenna 1003. The top layer 1007 can provide protection for these components and can also provide a surface to accept printing—for example printing of a number, a barcode, a logo, or other image.

It should be appreciated that in FIG. 10 the top view is a view looking through the top layer 1007, the side view is a cross sectional side view, and the bottom view is a view looking though the adhesive layer 1006 at the tamper track 1005 and adhesion modifying layer 1008.

The tamper track 1005 is preferably applied to the underside of the substrate layer 1001, along with one or more layers of adhesion modifying coating 1008 to enhance the destructibility of the tamper track 1005. Consequently, if the label 1000 is applied to a surface and subsequently tampered or removed, the tamper track 1005 should be broken or disrupted so as to interrupt the electrical connection between the through-connect points 1004 on the underside of the substrate layer 1001.

The tamper track 1005 may be laid out in a number of different ways on the underside of the substrate layer 1001. In the preferred embodiment illustrated in FIG. 10, the tamper track runs from one through-connect point 1004 almost all the way around the perimeter of the underside of the substrate layer 1001 and then back to the other through-connect point 1004, with the outward and return paths of the tamper track 1005 very close together in order to avoid any electrical induction effects which may interfere with the antenna 1003 positioned above on the upper surface of the substrate layer 1001. The width and thickness of the tamper track 1005 can be adjusted to provide the correct properties in terms of electrical resistance and physical destructibility. The path made by the tamper track 1005 may run inside, or outside, or directly beneath the antenna 1003, which in FIG. 10 is an induction loop. In one preferred embodiment the tamper track 1005 forms a path which is outside the outer perimeter of the induction loop 1003, thereby ensuring that any disturbance around the perimeter of the label 1000 will cause the tamper track 1005 to be disrupted.

When the label 1000 is applied to a surface, the tamper track 1005 is intact and the corresponding contact pads on the chip 1002 are electrically connected to each other. When the label 1000 is removed or substantially tampered with, the tamper track 1005 should be broken or disrupted and there will then be an open circuit between the corresponding contact pads on the chip 1002. When such an open circuit occurs, the response of the RFD chip 1002 or the information stored in the chip 1002 will be modified in a way which can be detected by an RFID reader.

If the label 1000 is passive (i.e. without an on-board battery or other power source), the modified chip response or modified chip information can be detected during the first read operation of the label after the label 1000 is removed or tampered, and the reader (if it has a write capability) can be programmed to write data back to the chip 1002 to indicate that the label 1000 has been removed or tampered. Said data which is written back to the chip 1002 to indicate removal or tampering of the label 1000 is preferably permanent and irreversible, to prevent the memory contents of the chip being altered back to the original state to disguise the fact that the label has been moved or tampered. There is therefore disclosed herein an RFD read/write device capable of detecting the change in RFD performance of the label 1000 when the label 1000 is tampered, and writing data back to the chip 1002 within the label 1000 to indicate such tampering has occurred, said data preferably being written into the chip 1002 so as to be permanent and irreversible.

If the label 1000 is active (i.e. has an on-board battery or other power source), it can be configured such that any disruption to the tamper track 1005 can be detected internally within the label 1000 without requiring an RFID read operation. When such disruption to the tamper track 1005 is detected internally, the chip 1002 can be programmed to modify its own memory contents to indicate that the label 1000 has been removed or tampered. Said modification to the memory contents of the chip 1002 to indicate removal or tampering of the label 1000 should preferably be permanent and irreversible, to prevent the memory contents of the chip being altered back to the original state to disguise the fact that the label has been moved or tampered.

Hence the label 1000 may function as a normal RFID label when it is first applied to a surface. After is the label is moved or tampered, the RFID function of the label 1000 may be maintained and information can be read from and written to the RFD chip 1002, while the label 1000 also provides an RFID means to determine that it has been moved or tampered.

Figure 11A:
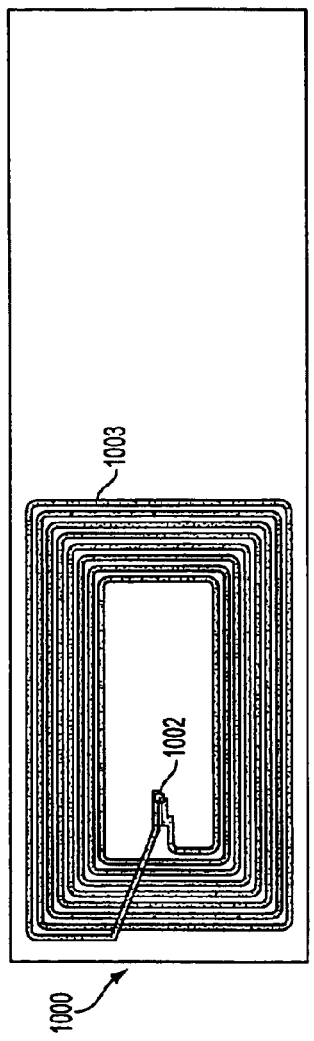
FIGS. 11A–11C are a schematic illustration of a variation of the RFID label designs of FIGS. 9 and 10.
Figure 11B:
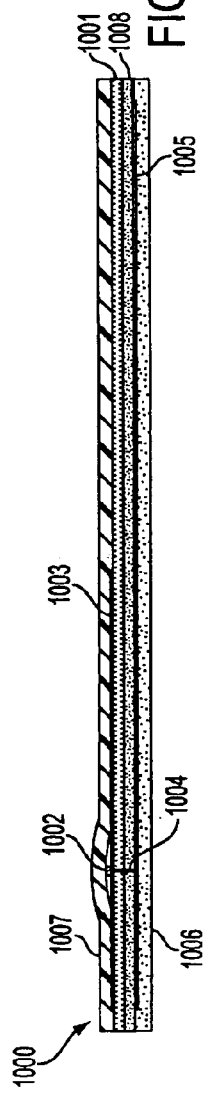
Figure 11C:
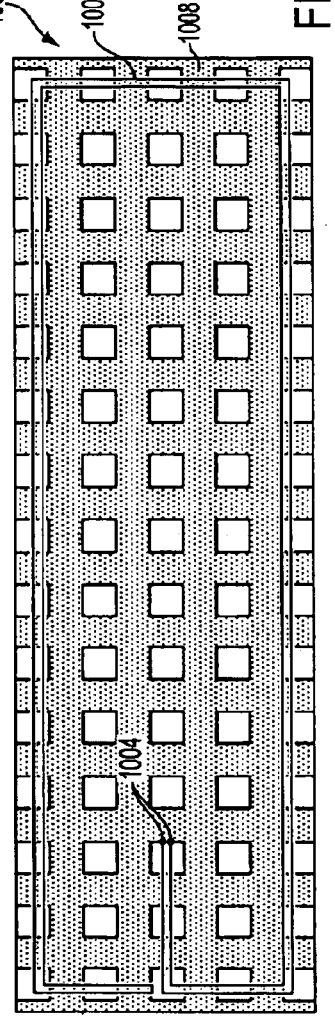

FIGS. 11A–11C are a variation on the preferred embodiment of FIGS. 9 and 10. The basic design of the label 1000 in FIG. 11 is similar to that of FIG. 10. The difference in the design of FIG. 11 is that the tamper track 1005 extends well beyond the antenna 1003 or other RFID components in at least one direction. The tamper track 1005 should preferably run around the perimeter of the label 1000 and detect tampering of any edge portion of the label, whether near the chip 1002 and antenna 1003 or at the end of the label away from these components. The label 1000 can, for example, be applied around a corner so that the chip 1002 and antenna 1003 are on a flat surface while the other end of the label 1000, which includes the tamper track 1005, extends around said corner. One or more adhesion modifying layers 1008 may also be provided on the underside of the substrate layer 1001, as described herein, to promote damage to the tamper track 1005 if the label 1000 is tampered or removed from a surface to which it has been applied.

FIGS. 12A–12E are another variation on the embodiment of FIGS. 10 and 11. FIG. 12 is a schematic illustration of a tamper indicating RFID loop tag 1200, shown in top view, side view and bottom view.

In FIG. 12, the tamper track 1005 on the underside of the substrate 1001 extends beyond the antenna 1003 and forms a "tail" 1201. In the embodiment shown in FIG. 12, the tamper track 1005 is straight and connects the two through-connect points 1004. The substrate 1001 may be cut approximately to the shape of the electronics, so that the loop tag 1200 is broad at the end which includes the antenna 1003 and narrow at the tail 1201. Alternatively, the loop tag may be cut into any other shape around the electronic components. Preferably, the tamper track 1005 will extend to the end of the tail 1201.

A bottom layer 1202 may also be applied to a specific portion of the underside of the substrate 1001 and tamper track 1005. The tamper track should extend into the region 1203 of the underside of the substrate 1001 which is not covered with the bottom layer 1202. In the region 1203 where the bottom layer 1202 is not applied, an adhesive, such as a pressure sensitive adhesive 1204 may be applied to the underside of the substrate 1001 and the tamper track 1005. As described herein, an adhesion modifying layer may also be included in the region 1203.

A top layer 1007 may be applied over the top of the substrate 1001, chip 1002 and antenna 1003. The top layer 1007 may provide protection for these components and may also provide a surface to accept printing—for example printing of a number, a barcode, a logo, or other image.

It should be appreciated that in FIG. 12 the top view (FIG. 12A) is a view looking through the top layer 1007 to the chip 1002 and antenna 1003, and the bottom view (FIG. 12C) is a view looking through the bottom layer 1202 and adhesive 1204 to the tamper track 1005 and through-connects 1004.

In operation, the loop tag 1200 may be bent into a loop 1205 (FIG. 12D) and the region 1203 of pressure sensitive adhesive can be pressed against a region of the bottom layer 1202, as shown. The pressure sensitive adhesive 1204 should hold the loop 1205 closed. In another variation, a loop 1206 (FIG. 12E) may be formed by pressing the region 1203 of pressure sensitive adhesive 1204 against a region of the top layer 1007, as also shown. (It should be noted that the illustrations of the loops 1205 and 1206 do not show the internal components—such as the chip 1002, antenna 1003 and tamper track 1005—or the separate layers of the loop tag construction.) The two regions of the loop tag which are joined together in this way by the pressure sensitive adhesive 1204 preferably both include electronics—for example, the chip 1002, or the antenna 1003, or the tamper track 1005—in order to ensure the closed loop cannot be cut and the loop opened without the RFD performance of the loop tag 1200 being affected. For example, the tamper track tail 1201 may be looped back and fixed to another portion of the tamper track tail 1201 or may be looped back and fixed to a region of the underside of the antenna 1003 (as illustrated in the loop 1205). The substrate 1001, pressure sensitive adhesive 1204, tamper track 1005, and any adhesion modifying coatings which are applied (as described in relation to FIGS. 9 and 10), are preferably designed as described herein such that the tamper track 1005 is damaged when the closed loop is pulled apart in the region of pressure sensitive adhesive 1204, thereby modifying the RFID performance of the loop tag 1200, as described above in relation to the label constructions of FIGS. 9 and 10. A similar modification to the performance of the loop tag 1200 will occur if the closed loop 1205 or 1206 is cut in order to open the loop.

Figure 13A:
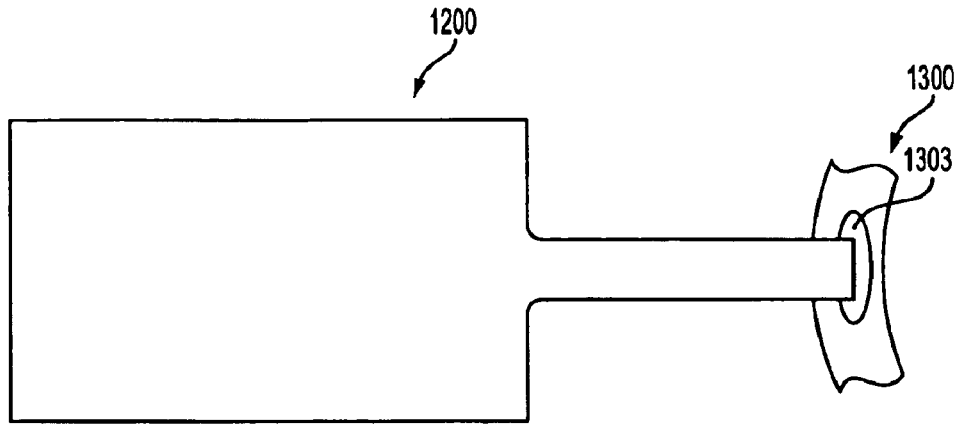
FIGS. 13A–13C are a schematic illustration of the use of a loop tag of the type illustrated in FIG. 12.
Figure 13B:
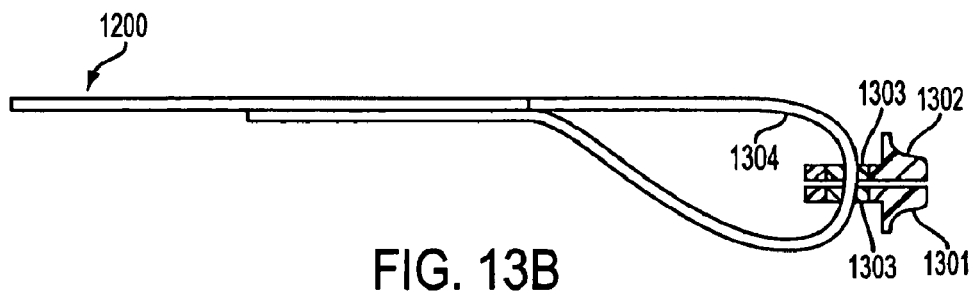
Figure 13C:
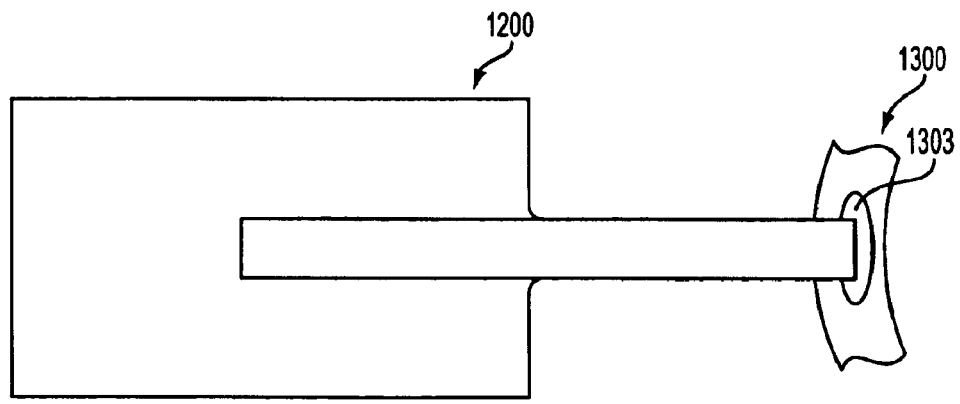

The loop tag configuration illustrated in FIG. 12 may be used to secure the tag 1200 around an item such as a handle, or to secure two items together. FIGS. 13A–13C are a schematic illustration of the use of the loop tag 1200 to detect opening of a container 1300 which includes a body 1301 and lid 1302. The body 1301 and lid 1302 have holes 1303 which align when the lid 1302 is placed properly on the body 1301 of the container 1300. FIG. 13 shows a cutaway cross sectional view (FIG. 13B) of a portion of the body 1301 and lid 1302 of the container 1300 in the region of the holes 1303. In this embodiment the loop tag 1200 is applied to the container 1300 with the open loop portion 1304 passing through the aligned holes 1303. In this implementation the RFID chip 1002 in the loop tag 1200 may store information about the contents of the container 1300. If the loop tag 1200 is removed from the container 1300, either by pulling the loop 1304 apart to open the loop or by cutting the loop tag 1200, the tamper track 1005 will be interrupted and the RFID performance of the loop tag 1200 will be modified in a manner detectable by an RFID reader, as described above in relation to the label construction of FIGS. 9, 10, 11 and 12.

It should be appreciated that the loop tag 1200 does not need to have a narrow tail region. The loop tag may instead be rectangular in shape, as illustrated schematically in the embodiment of FIG. 11.

It should be appreciated that variations on the preferred embodiments of FIGS. 9 to 13 are possible.

Figure 14:
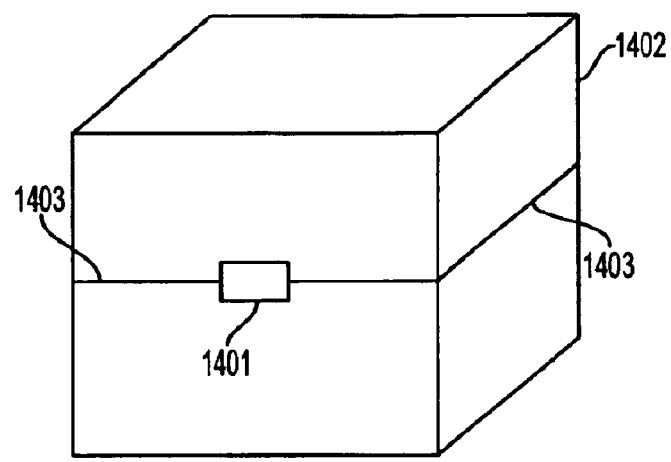
FIG. 14 is a schematic illustration of an object with an integrated electrically conducting path and having a tamper indicating RFID label applied to the object so as to connect to the conducting path on the object and thereby provide an integrated tamper indicating function for the object.

In one embodiment of the invention, a tamper indicating label is incorporated with an object to which the label is to be applied. The label used maybe any of the embodiments described above. FIG. 14 illustrates a label 1401 applied to an object 1402. A conductive path 1403 should be incorporated into the object 1402. For example, a conducting path of electrically conducting ink may be formed around the object 1402. The conducting path 1403 on the object 1402 should have at least two end points. The tamper tracks in the label 1401 should have a corresponding number of connection points. When the label 1401 is applied to the object 1402, each end point should be connected to a connection point. The conducting path on the object 1402 and the tamper tracks in the label 1401 should together form one or more circuits, each from a tamper track to an endpoint, through the conducting path on the object 1402, to the other end point and back to a tamper track. If a tamper track is disrupted through the label 1401 being tampered, or if connection between a tamper track and the conducting path on the object 1402 is broken, the RFID function of the label 1401 may be modified in a manner as described above to indicate tampering. For example, if the label 1401 is applied to a cardboard box and the entire label and that part of the box that the label is adhered to is cut out, tampering is indicated.

The embodiments illustrated and discussed in this specification are intended only to teach those skilled in the art the best way known to the inventors to make and use the invention. Nothing in this specification should be considered as limiting the scope of the present invention. The above-described embodiments of the invention may be modified or varied, and elements added or omitted, without departing from the invention, as appreciated by those skilled in the art in light of the above teachings. It is therefore to be understood that, within the scope of the claims and their equivalents, the invention may be practiced otherwise than as specifically described.

I claim:

1. A tamper indicating label comprising:
    an RFID (radio frequency identification) layer providing an RFID function;
    an attachment layer supporting the RFID layer and to attach the tamper indicating label to a surface;
    a destructible electrically conducting path between the RFID layer and the attachment layer;
    a pattern of an adhesion modifying coating to modify adhesion characteristics of the destructible conducting path to the RFID layer or the attachment layer, whereby the destructible conducting path is disrupted when the label is tampered, thereby modifying the RFID function of the RFID layer.

2. The tamper indicating label of claim 1 wherein the destructible conducting path is an RFID component.

3. The tamper indicating label of claim 1 wherein the destructible conducting path is connected to RFID components in the RFID layer.

4. The tamper indicating label of claim 1 wherein the RFID layer includes an RFID integrated circuit and one of an antenna and an induction loop.

5. The tamper indicating label of claim 1 wherein the adhesion modifying coating covers a majority of an area of contact between the RFID layer and the attachment layer.

6. The tamper indicating label of claim 1 wherein the adhesion modifying coating is between the RFID layer and destructible electrically conducting path.

7. The tamper indicating label of claim 1 wherein the adhesion modifying coating is between the destructible electrically conducting path and the adhesive layer.

8. The tamper indicating label of claim 1 wherein the pattern of the adhesion modifying coating includes at least two types of adhesion modifying coating.

9. The tamper indicating label of claim 1 further comprising a visual tamper indicator arranged under the RFID layer and wherein the RFID layer is substantially transparent whereby the visual tamper indicator is visible.

10. The tamper indicating label of claim 9 wherein the visual tamper indicator is a colored layer and an adhesion-modifying substance is arranged between the RFID layer and the adhesive layer, the adhesion-modifying substance causing the colored layer to have different adhesion strengths with respect to the RFID layer and the attachment layer to thereby create a visual pattern on tampering of the label.

11. The tamper indicating label of claim 9 further comprising:
    a visual tamper indicator comprising a colored layer arranged under the RFID layer and wherein the RFID layer is substantially transparent, whereby the visual tamper indicator is visible; and an adhesion-modifying substance arranged between the RFID layer and the adhesive layer, the adhesion-modifying substance causing the colored layer to have different adhesion strengths with respect to the RFID layer and the adhesive layer to thereby create a visual pattern on tampering of the label.

12. The tamper indicating label of claim 1 where the destructible electrically conducting path is formed from a conductive ink.

13. A tamper indicating label comprising:
    a substrate having RFID components and a destructible conducting path; and
    an attachment layer supporting the substrate, at least a part of the destructible conducting path being in contact with the attachment layer;
    an adhesion-modifying coating disposed between the substrate and the attachment layer, the adhesion-modifying coating causing relative adhesion strengths of the destructible conducting path to the substrate and the attachment layer to vary, whereby the destructible conducting path is modified if the label is at least partially removed from a surface to which it has been applied, thereby modifying RFID characteristics of the RFID components.

14. The tamper indicating label of claim 13 further comprising:
    a second conducting path formed on a top surface of the substrate and wherein the RFID components include an integrated circuit chip on the top surface of the substrate, the integrated circuit chip being connected to the second conducting path; and
    through-connects linking the second conducting path with the destructible conducting path, which is formed on a bottom surface of the substrate between the substrate and the attachment layer.

15. The tamper indicating label of claim 14 wherein the second conducting path and the destructible conducting path together form one of an antenna and an induction loop.

16. The tamper indicating label of claim 13, further comprising a top coating formed over the top surface of the substrate.

17. The tamper indicating label of claim 13 wherein the adhesion-modifying coating is between the substrate and the destructible electrically conducting path.

18. The tamper indicating label of claim 13 wherein the adhesion-modifying coating is between the destructible electrically conducting path and the attachment layer.

19. The tamper indicating label of claim 13 wherein the adhesion-modifying coating includes at least two types of adhesion-modifying coating.

20. The tamper indicating label of claim 14 wherein the second conducting path forms one of an antenna and an induction loop, and the destructible conducting path forms a functionally separate tamper detection electrical circuit.

21. The tamper indicating label of claim 14 further comprising a top coating formed over the top surface of the substrate.

22. The tamper indicating label of claim 13 in which the destructible conducting path is formed from a printed electrically conductive ink.

23. A security label for attachment to an object, comprising:
   RFID components providing an RFID function;
   means for attaching the RFID components to the object;
   at least one conducting path connected to the RFID components and contacting the means for attaching,
   means for modifying adhesion between the RFID components and the means for attaching, whereby the at least one conducting path is interrupted or substantially disrupted when the label is partially or completely removed form a surface to which it has been applied, thereby modifying RFID characteristics of the RFID components.

24. The security label of claim 23 further comprising a substrate supporting the RFID components and wherein the means for attaching comprises a layer of adhesive contacting the substrate and wherein the means for modifying the adhesion comprises an adhesion modifying substance in contact with the at least one conducting path and at least one of the substrate and the layer of adhesive, the adhesion modifying substance modifying relative adhesion of the at least one conducting path to promote disruption to or interruption of the at least one conducting path when the label is partially or completely removed from the surface to which it has been applied, thereby modifying the RFID characteristics of the RFID components.

25. The security label of claim 23 further comprising:
   a substrate, the RFID components being formed on a top surface of the substrate; and
   connection points extending from the RFID components to a bottom surface of the substrate, the means for attaching contacting the bottom surface of the substrate, wherein the at least one conducting path is formed on a bottom surface of the substrate and connects to the connection points.

26. The security label of claim 24 wherein the at least one conducting path must be intact for the RFID components to operate.

27. The security label of claim 25 wherein the at least one conducting path is a circuit functionally separate from the RFID components.

28. The security label of claim 25 wherein the at least one conducting path is a track of conducting material formed in a pattern that extends around substantially the entire circumference of the bottom surface of the substrate.

29. The security label of claim 25 wherein the RFID components include an induction loop or antenna and the at least one conducting path is formed in series with the induction loop or antenna.

30. The security label of claim 25, wherein the at least one conducting path forms an induction loop or antenna.

31. The security label of claim 23 further comprising:
   a substrate, the RFID components formed on a top surface of the substrate; and
   connection points extending from the RFID components to a bottom surface of the substrate, wherein a portion of the at least one conducting path extends from each connection point to form an induction loop or antenna.

32. The security label of claim 31 wherein the at least one conducting path must be intact for the RFID components to operate.

33. The security label of claim 24 wherein the RFID components comprise an RFID integrated circuit on a bottom surface of the substrate, the means for attaching contacts the bottom surface of the substrate, and the at least one conducting path forms one of an antenna and an induction loop on the bottom surface of the substrate.

34. The security label of claim 33 wherein the at least one conducting path must be intact for the RFID components to operate.

35. The security label of claim 24, wherein the RFID components include an induction loop or antenna and the at least one conducting path is formed in parallel with the induction loop or antenna.

36. The tamper indicating label of claim 23 wherein the at least one conducting path is made from an electrically conductive ink.

37. A tamper indicating RF identification system, comprising:
   a substrate having a top and a bottom surface;
   RFID components applied to the bottom surface of the substrate;
   an electrically conductive layer applied in a pattern to the bottom surface of the substrate;
   an adhesive layer supporting the substrate such that the RFID electronic components and the conductive layer are sandwiched between the substrate and the adhesive layer, and wherein the adhesive layer, the substrate, and conductive layer have relative adhesion strengths such that when the system is partially removed from a surface to which it has been applied, at least one of the RFID components and the conductive layer is altered to modify the RFID characteristics of the system.

38. The system of claim 37 further comprising an adhesion modifying layer provided between the substrate and the adhesive layer to adjust the relative adhesions strengths of the electrically conductive layer and thereby promote damage to the electrically conductive layer when the system is partially removed from a surface to which it has been applied.

39. A security apparatus for indicating tampering, comprising:
   an object having a conducting path with at least two end points;
   a security label arranged on the object, the label comprising RFID components and a destructible conducting path between the RFID components and individual end points.

40. The apparatus of claim 39 wherein a disruption to the destructible conducting path or the conducting path causes a detectable modification to the RFID function of said RFID components.

41. The apparatus of claim 39 wherein the RFID components respond in a pre-determined manner when a connection between the RFID components and end points is interrupted or substantially disrupted, or when the electrical pathway through the conducting path and the destructible conducting path is interrupted or substantially modified.

42. The combination of a security label and an object, wherein:

the security label comprises:
RFID components;
means for attaching the RFID components to the object; and
destructible electronics connected to the RFID components, the destructible electronics being broken or substantially disrupted when the label is at least partially removed from the object; and the object comprises:
a surface for receiving the security label;
a conducting path having two ends, the ends of the conducting path being coupled to the destructible electronics thereby forming a circuit through the RFID components, the destructible electronics and the conducting path, whereby RFID characteristics of the RFID components are modified if the connection between the end points and the RFID components, via the destructible electronics, or through the conducting path, is interrupted or substantially disrupted.

43. A tamper indicating label, comprising:
RFID components provided on a substrate;
means for attaching the RFID components to an object;
a tamper track connected to the RFID components, the tamper track being one or more electrically conducting pathways adapted to be damaged when the label is tampered and the RFID components being adapted to detect an interruption in, or substantial disruption to, the tamper track while maintaining their RFID capability; and
means for modifying the adhesion of the tamper track, whereby the tamper track adheres partially to the means for attaching and partially to the substrate when the label is tampered.

44. The label of claim 43 wherein the tamper track is interrupted or substantially disrupted when the means for attaching is interfered with.

45. The label of claim 43 wherein the RFID components are active components.

46. The label of claim 45 wherein the RFID components test the tamper track and record data if the tamper track is significantly damaged or interrupted.

47. The label of claim 43 wherein the RFID components are passive.

48. The label of claim 43 wherein the RFID components comprise an RFID integrated circuit and one of an induction loop and an antenna.

49. The label of claim 43 wherein the RFID components are permanently altered when the interruption in the tamper track is detected by an RFID read/write device.

50. The label of claim 43 wherein the means for attaching is a layer of pressure sensitive adhesive.

51. A tamper indicating label, comprising:
a substrate;
an adhesive layer;
a tamper track arranged between a first side of the substrate and the adhesive layer;
an adhesion modifying layer arranged in a pattern between the first side of the substrate and the adhesive layer so that portions of the tamper track have different adhering strengths to the substrate and the adhesive layer whereby the tamper track is disrupted when the label is tampered with;
an RFID integrated circuit arranged on a second side of the substrate and electrically connected to the tamper track via through connects in the substrate, the RFID chip being connected to other RFID components to provide an RFID function and to detect any disruption in the tamper track while maintaining the RFID function.

52. The label of claim 51, wherein the RFID chip is permanently altered when the tamper track is disrupted.

53. The label of claim 51, further comprising one of an antenna and an induction loop formed on the second side of the substrate and connected to the RFID integrated circuit to provide an RFID function.

54. The label of claim 53, wherein one of the antenna and the induction loop are connected to the RFID chip via two contact pads.

55. The label of claim 51 wherein when the tamper track is interrupted, or significantly disrupted, the functions or characteristics of the RFID chip are altered in a manner detectable by an RFID reading device so as to indicate the tamper track has been interrupted or significantly disrupted.

56. A tamper indicating label comprising:
a substrate having first and second portions, the second portion being adapted to be looped back and connected to the first portion to from a closed loop;
an RFID transponder arranged on the first portion;
a tamper track coupled to the RFID transponder and extending at least partially into the second portion of the substrate;
an adhesive layer arranged on at least a part of the substrate in the second portion that contains the tamper track;
an adhesion modifying coating provided in a pattern between the adhesive layer and the substrate in the region of the tamper track so as to vary the relative adhesion strength of the tamper track and thereby promote modification to the tamper track in that part of the substrate when the closed loop is tampered.

57. The label of claim 56 wherein the second portion is looped back and attached to the first portion by the adhesive layer, the attachment being in an area where either the RFID transponder or the tamper track is arranged.

58. The label of claim 56 wherein a second adhesive layer is arranged on the first portion of the substrate in an area where the second portion is attached.

59. The label of claim 56 further comprising a top or bottom layer formed on regions of the substrate where the adhesive layer is not present.

60. The label of claim 56 wherein the RFID transponder maintains its RFID function if the closed loop is tampered or cut so that the tamper track is modified, and also detects the modification in the tamper track due to the closed loop being tampered or cut.

61. An RFID read/write apparatus, comprising:
means for reading information from an RFID label;
means for interpreting the information to determine if the label is tampered; and
means for writing data to the label indicating the label is tampered if the information indicates the label is tampered.

62. The apparatus of claim 61 wherein the data is written permanently to an electronic memory in the label.

63. A tamper indicating apparatus, comprising:
RFID components providing an RFID function;
a destructible conducting path associated with the RFID components;
an attachment layer to attach the RFID components and the destructible conducting path to an object, the attachment layer contacting at least part of the destructible conducting path; and an adhesion modifier to provide differing relative adhesion strengths of the destructible conducting path so as to promote disruption to the destructible conducting path if the RFID components or attachment layer are tampered with, wherein the RFID components comprise means for detecting and indicating a disruption in the destructible conducting path.

64. The apparatus of claim 63, wherein the RFID components further comprise an electronic memory, the electronic memory contents being modified when a disruption in the destructible conducting path is detected.

65. The apparatus of claim 64, wherein the RFD components further comprise a clock, the electronic memory recording the date and time when the disruption is detected.

66. The apparatus of claim 64, wherein the data stored in the electronic memory is permanently modified.

67. The apparatus of claim 63, wherein the RFID components are active RFID components.

68. The apparatus of claim 63 wherein the RFID components are passive.

69. The apparatus of claim 63 wherein the RFID components comprise an RFID integrated circuit and one of an antenna and an induction loop.

70. A tamper indicating RF identification system, comprising:

a substrate having a top and a bottom surface;

RFID components applied to the top surface of the substrate;

an electrically conductive layer applied in a pattern to the bottom surface of the substrate and connected to the RFID components on the top surface of the substrate;

an adhesive layer supporting the substrate such that the conductive layer is sandwiched between the substrate and the adhesive layer, and wherein the adhesive layer, the substrate, and conductive layer have relative adhesion strengths such that when the system is partially removed from a surface to which it has been applied, the conductive layer is altered so as to modify the RFID characteristics of the system.

71. The system of claim 70 further comprising an adhesion modifying layer provided between the substrate and the adhesive layer to adjust the relative adhesions strengths of the conductive layer and thereby promote damage to the conductive layer when the system is partially removed from a surface to which it has been applied.

* * * * *